(12) United States Patent
Riman et al.

(10) Patent No.: US 11,332,847 B2
(45) Date of Patent: May 17, 2022

(54) METHODS FOR LOW ENERGY INORGANIC MATERIAL SYNTHESIS

(71) Applicant: Rutgers, The State University of New Jersey, New Brunswick, NJ (US)

(72) Inventors: Richard E. Riman, Piscataway, NJ (US); Daniel Kopp, Fair Lawn, NJ (US)

(73) Assignee: RUTGERS, THE STATE UNIVERSITY OF NEW JERSEY, New Brunswick, NJ (US)

( * ) Notice: Subject to any disclaimer, the term of this patent is extended or adjusted under 35 U.S.C. 154(b) by 545 days.

(21) Appl. No.: 16/067,180

(22) PCT Filed: Dec. 29, 2016

(86) PCT No.: PCT/US2016/069352
§ 371 (c)(1),
(2) Date: Jun. 29, 2018

(87) PCT Pub. No.: WO2017/117475
PCT Pub. Date: Jul. 6, 2017

(65) Prior Publication Data
US 2019/0010628 A1    Jan. 10, 2019

Related U.S. Application Data

(60) Provisional application No. 62/272,298, filed on Dec. 29, 2015.

(51) Int. Cl.
*C30B 7/10* (2006.01)
*B01D 7/02* (2006.01)
(Continued)

(52) U.S. Cl.
CPC .............. *C30B 7/10* (2013.01); *B01D 7/02* (2013.01); *C01B 33/24* (2013.01); *C04B 35/01* (2013.01);
(Continued)

(58) Field of Classification Search
CPC ..... B01D 7/02; C01B 33/24; C04B 2235/442; C04B 2235/604; C04B 35/01; C04B 35/22; C04B 35/44; C04B 35/443; C04B 35/64; C04B 28/188; C04B 28/18; C30B 1/02; C30B 1/10; C30B 29/22; C30B 1/12
See application file for complete search history.

(56) References Cited

U.S. PATENT DOCUMENTS 3,501,323 A      3/1970   Moorehead et al.
3,966,884 A  *   6/1976   Jacob ................... C01B 33/22
                                                        423/331

(Continued)

OTHER PUBLICATIONS

Chem-on.com.sg. 2021. [online] Available at: <https://www.chem-on.com.sg/image/catalog/product_catalog/TDS%20-%20WOLLASTONITE%20NYAD%20G.pdf> [Accessed Aug. 28, 2021]. (Year: 2021).*

(Continued)

*Primary Examiner* — Matthew J Song
(74) *Attorney, Agent, or Firm* — Fox Rothschild LLP

(57) ABSTRACT

The present invention relates to solvothermal vapor synthesis methods for the crystallization of a phase from a mixture of selected inorganic or organic precursors in an unsaturated vapor-phase reaction medium.

17 Claims, 33 Drawing Sheets

(51) Int. Cl.

| | |
|---|---|
| *C30B 1/10* | (2006.01) |
| *C30B 1/12* | (2006.01) |
| *C04B 35/01* | (2006.01) |
| *C30B 1/02* | (2006.01) |
| *C04B 35/64* | (2006.01) |
| *C04B 35/468* | (2006.01) |
| *C30B 29/22* | (2006.01) |
| *C04B 35/462* | (2006.01) |
| *C04B 35/44* | (2006.01) |
| *C04B 35/443* | (2006.01) |
| *C01B 33/24* | (2006.01) |
| *C04B 35/22* | (2006.01) |

(52) U.S. Cl.
CPC .............. *C04B 35/22* (2013.01); *C04B 35/44* (2013.01); *C04B 35/443* (2013.01); *C04B 35/462* (2013.01); *C04B 35/468* (2013.01); *C04B 35/64* (2013.01); *C30B 1/02* (2013.01); *C30B 1/10* (2013.01); *C30B 1/12* (2013.01); *C30B 29/22* (2013.01); *C04B 2235/3203* (2013.01); *C04B 2235/3225* (2013.01); *C04B 2235/3239* (2013.01); *C04B 2235/3262* (2013.01); *C04B 2235/3275* (2013.01); *C04B 2235/3284* (2013.01); *C04B 2235/442* (2013.01); *C04B 2235/604* (2013.01)

(56) References Cited

U.S. PATENT DOCUMENTS

| | | | |
|---|---|---|---|
| 2004/0043053 A1* | 3/2004 | Yu | A61L 27/58 424/426 |
| 2006/0216226 A1 | 9/2006 | Mitsunaka et al. | |
| 2007/0221013 A1* | 9/2007 | Sakamoto | C04B 28/188 75/326 |
| 2007/0251275 A1* | 11/2007 | Bauer | C03C 1/02 65/375 |
| 2016/0340247 A1* | 11/2016 | Hill | C04B 28/06 |

OTHER PUBLICATIONS

Ivakin, et al: "Thermaovaporous Synthesis of Fine Crystalline Gahnite (ZnAl2O4)", 2006, Journal of Material Science, vol. 41, pp. 1377-1383.

Kozawa, et al: "Preparation of Beta-CaSIO3 Powder by Water Vapor-Assisted Solid-State Reaction", Journal of the Ceramic Society of Japan, 2013, vol. 121, No. 1, pp. 103-105.

Ivakin, et al: Kinetic Model and Mechanism of Y3A15O12 Formation in Hydrothermal and Thermov Aporous Synthesis, High Pressure Research, 2001, vol. 20, pp. 87-98.

Kozawa, et al: "Preparation of Alkaline-Earth Titanates by Accelerated Solid-State Reaction in Water Vapor Atmosphere", Journal of the European Ceramic Society, 2010, vol. 30, pp. 3435-3443.

Kozawa, et al: "Preparation of -CaSiO3 Powder by Water Vapor-Assisted Solid-State Reaction", Journal of the Ceramic Society of Japan, Jul. 30, 2012, vol. 121, pp. 103-105.

Zhang, et al: "Large Scale Preparation of [beta]—CaSiO3 Nanostructures by Solid-State Reaction in NaCl—H2O(v) System at Lower Temperature", Journal of the American Ceramic Society, Mar. 25, 2015, vol. 98, No. 7, pp. 2264-2268.

Yazdani, et al: "The Effect of Processing Parameters on the Hydrothermal Synthesis of Wollastonite at Low Pressure", Journal of Ceramic Processing Research, Jan. 1, 2013, vol. 14, No. 1, pp. 12-16.

Hashimoto, et al: "Formation of Needle-like Beta-Ca"2 SiO" 4 Crystals by Vapor Phase Reaction", Journal of Crystal Growth, Elsevier, Amsterdam, NL, Nov. 2, 1996, vol. 169, No. 2, pp. 376-379.

Kozawa, et al: "Water Vapor-Assisted Solid-State Reaction for the Synthesis of Nanocrystalline BaZrO3 Powder", Journal of The Ceramic Society of Japan, 2013, vol. 121, No. 3, pp. 308-312.

Assarsson, Go: "Hydrothermal Reactions Between Calcium Hydroxide and Amorphous Silica in Atmospheres of Unsaturated Steam", The Journal of Physical Chemistry, 1956, vol. 60, No. 11, abstract; pp. 1559-1560, table I.

Oxtoby, et al: "Principles of Modern Chemistry, Seventh Edition", Cengage Learning 2012, pp. 594.

* cited by examiner (a)

(b)

METHODS FOR LOW ENERGY INORGANIC MATERIAL SYNTHESIS

CROSS REFERENCE TO RELATED APPLICATIONS

This application is a National Stage application under 35 U.S.C. § 371 of international application number PCT/US2016/069352, filed on Dec. 29, 2016, which claims the benefit of priority under 35 U.S.C. § 119(e) to U.S. Application No. 62/272,298, filed Dec. 29, 2015, the entire contents of both of which is are hereby incorporated by reference.

FIELD OF THE INVENTION

The present invention is directed to a method for facilitating the crystallization of a phase from a mixture of selected inorganic or organic precursors in a vapor-phase reaction medium. By adjusting the temperature and the partial pressures of the reaction medium and monitoring any relevant partial pressures of other gases (i.e. $CO_2$), phases can be selectively partitioned out.

BACKGROUND

There are many inefficiencies and negative consequences of traditional material synthesis techniques (e.g., solid-state, sol-gel, mechano-chemical, hydrothermal). Hydrothermal chemistries have been studied and manipulated over several decades to enable crystal growth technologies and kinetically drive chemical reactions. Current hydrothermal synthesis techniques, such as liquid-phase hydrothermal synthesis (LPH), vapor-phase hydrothermal synthesis (VPH), supercritical water synthesis (SCW), and vapor-assisted solid-state synthesis (VS), suffer from a variety of disadvantages.

In traditional hydrothermal systems such as "liquid-phase hydrothermal" synthesis (LPH), the liquid water is used as the solvent and reaction medium and any reactants are always dispersed or submerged in it. Additives such as mineralizers are typically added to the water to enhance its solvation properties. The pressure within the hydrothermal autoclave is governed by the water liquid-vapor equilibrium phase boundary. This means that the liquid and gaseous water always coexist. However, certain products, such as $MgAl_2O_4$ (spinel) or $CaSiO_3$ (calcium silicate) cannot be synthesized using LPH reactions.

Similarly to "liquid-phase hydrothermal", "vapor-phase hydrothermal" synthesis (VPH) is also conducted below 374° C. and 3200 psi (22 MPa). Once again, this means that both liquid and gaseous water are in equilibrium throughout reaction progression. The difference, however, is in the precursor configuration. The precursors are suspended above the liquid phase and solely interact with water vapor or liquid water that condenses on a reactor surface and falls onto the powder mixture. This configuration allows precursor interactions with a gaseous atmosphere but is limited in versatility since an arbitrary pressure cannot be maintained constant over a range of temperatures. Instead, the pressure is fixed by Gibb's phase rule. In the case of a "bleed-out" valve being implemented, the pressure can remain constant, but liquid-vapor equilibrium will no longer be maintained, which could create a need for water replenishment and/or large variations in pressure.

Supercritical water synthesis (SCW), which reacts precursors at supercritical temperature and pressure, typically requires thick-walled corrosion-resistant autoclaves. The cost of this vessel increases dramatically when approaching or exceeding the supercritical limit of water due to the corrosive properties of supercritical water.

Other methods such as vapor-assisted solid-state reactions are kinetically controlled, rather than thermodynamically controlled. Further, these vapor-assisted reactions are operating under equilibrium controlled reaction conditions (pressure is fixed at 1 atm) and therefore are limited in versatility due to the Gibb's phase rule.

Thus, a need exists for a versatile, thermodynamically controlled, low temperature method to crystallize inorganic oxides from readily available materials. Such a method will also minimize undesirable environmental impact.

SUMMARY OF THE DISCLOSURE

The present invention relates to methods of facilitating the crystallization of a phase from a mixture of preselected organic or inorganic precursors in a vapor-phase reaction medium. Methods of the present invention also demonstrates the understanding of pressure control within an autoclave and the reaction thermodynamics between selected precursors and allows for reaction manipulation at temperature and pressure much lower than what has been known in the field.

One aspect of the invention provides a method of synthesizing an inorganic product, the method comprising:
  providing inorganic compound sources of reaction elements, wherein said reaction elements react to form one or more inorganic products;
  providing a reaction medium;
  adding the reaction elements and reaction medium to a reaction vessel;
  forming an unsaturated vapor phase of the reaction medium at a predetermined temperature and non-standard pressure;
  And reacting the reaction elements in said unsaturated vapor phase of the reaction medium to form at least one inorganic reaction product;
  wherein one or more of the temperature, unsaturated vapor pressure, and partial pressure of any gases added or produced are selected to reduce the non-standard state change in Gibb's free energy of the reaction system for the formation of the at least one inorganic reaction product to less than or equal to zero kJ/mol.

In some embodiments, the reaction medium comprises water and forms unsaturated water vapor at the predetermined temperature and non-standard state pressure. In some embodiments, the reaction medium comprises an inorganic species or an organic species and forms unsaturated inorganic or organic vapor at the predetermined temperature and non-standard state pressure. In some embodiments, the reaction medium comprises a mixture of organic and inorganic species, wherein at least one of the species forms an unsaturated vapor phase at the predetermined temperature and non-standard state pressure. In some embodiments, all but one of the species can be at saturated, subcritical, or critical pressures at the predetermined temperature and non-standard state pressure. In some embodiments, the reaction medium comprises at least one of water, ammonia, ethanol, methanol, acetone, toluene, or benzene.

In some embodiments, the reaction elements are suspended above the reaction medium within the reaction vessel.

In some embodiments, the amount of reaction medium added to the reaction vessel is determined using an equation of state model for the reaction of said reaction elements to form said reaction product to calculate the amount of reaction medium to be added. In some embodiments, said state model is a non-ideal gas model.

In some embodiments, the temperature and non-standard state pressure are maintained for less than about 60 hours. In some embodiments, the temperature and non-standard state pressure are maintained for less than about 10 hours.

In some embodiments, the reaction vessel is a continuous reaction vessel. In some embodiments, the reaction vessel is a batch reaction vessel. In some embodiments, the reaction vessel is a semi-continuous reaction vessel.

In some embodiments, the method further comprises adding a solute to the reaction medium. In some embodiments, the concentration of the solute is between 0.1 and 80 wt %. In some embodiments, the solute is sodium chloride.

In some embodiments, the method further comprises combining the inorganic compound sources with a catalyst. In some embodiments, the catalyst comprises a soluble or insoluble compound. In some embodiments, the catalyst is a salt. In some embodiments, the salt is sodium chloride. In some embodiments, the salt is sodium hydroxide.

In some embodiments, the at least one inorganic reaction product is of the form $Ca_aSi_bO_c(CO_3)_d(OH)_e$, wherein a, b, and c are each a value greater than 0, f is equal to or greater than 0, and a+2b=c.

In some embodiments, the inorganic compound sources comprise a silicon source and a calcium oxide source. In some embodiments, the silicon source is selected from quartz, silica flour, siliceous sand, diatomaceous earth, clays, silica gel, or combinations thereof. In some embodiments, the calcium oxide source is selected from calcium carbonate, calcium oxide, calcium hydroxide, or combinations thereof.

In some embodiments, the mole ratio between the silicon in the silicon source and the calcium oxide in the calcium oxide source ranges from about 0.5:1 to 3:1.

In some embodiments, the calcium oxide source comprises more than about 70% calcium hydroxide by weight. In some embodiments, the calcium oxide source comprises more than about 70% calcium carbonate by weight.

In some embodiments, the at least one inorganic reaction product is selected from scawtite, wollastonite, xonotlite, and quartz.

In some embodiments, the at least one inorganic reaction product has the chemical formula of $A_a\ B_b\ C_c\ Z_z\ Y_y\ X_x\ (\alpha)_f(\beta)_g\ (\gamma)_h \cdot i(\delta) \cdot j(\varepsilon) \cdot k(\theta)$, wherein
A, B, and C are each a single or multi-elemental cation species;
Z, Y, and X are each a single or multi-elemental anion species;
A, β, and γ are each a charged molecule;
Δ, ε, θ are each a neutral molecule; and
a, b, c, d, e, f, g, h, i, j, and k are values equal to or greater than 0.

In some embodiments, the non-standard state change in Gibb's free energy is reduced below zero kJ/mol. In some embodiments, the non-standard state change in Gibb's free energy is equal to zero kJ/mol. In some embodiments, the non-standard state change in Gibb's free energy is reduced by the unsaturated vapor phase. In some embodiments, the non-standard state change in Gibb's free energy is reduced by the addition of a gaseous species to the reaction vessel. In some embodiments, the non-standard state change in Gibb's free energy is reduced by the addition of a liquid species to the reaction vessel. In some embodiments, the non-standard state change in Gibb's free energy is reduced by the addition of a solid species to the reaction vessel. In some embodiments, the non-standard state change in Gibb's free energy is reduced by the production of a gaseous species. In some embodiments, wherein the non-standard state change in Gibb's free energy is reduced by the production of a liquid species. In some embodiments, the non-standard state change in Gibb's free energy is reduced by the production of a solid species. In some embodiments, the non-standard state change in Gibb's free energy is reduced by removing a species from the reaction vessel. In some embodiments, the removal of the species from the reaction vessel is accomplished by outgassing the reaction vessel. In some embodiments, the partial pressure of any gases added or produced are independently between 0.0000001 and 10,000 atm.

Another aspect provides a compound prepared according to methods of the present invention.

DETAILED DESCRIPTION OF PREFERRED EMBODIMENTS

The present invention provides versatile methods of synthesizing inorganic products at relatively low temperatures and pressure. In particular, the present invention provides a method of "solvothermal vapor synthesis" (SVS) for facilitating the crystallization of a phase from a mixture of selected inorganic or organic precursors in the unsaturated vapor phase of a reaction medium. In some embodiments, the reaction medium is water, and the method referred to as "hydrothermal vapor synthesis" (HVS).

The HVS method for the synthesis of inorganic products can be engineered provided that the reactant and product thermodynamics are known. The systematic approach for reaction calculations described herein can be applied to a very large range of material systems. For example, the present invention provides a direct methodology for the synthesis of inorganic oxides such as $MgAl_2O_4$ (Magnesium Aluminate Spinel), $\beta$-$CaSiO_3$ (Calcium Silicate, Wollastonite), $Y_3Al_5O_{12}$ (YAG), $SrZrO_3$ (Strontium Zirconate), $ZnAl_2O_4$ (Zinc Aluminate), $CaTiO_3$ (Calcium Titanate), $Ba_2Ti_9O_{20}$, $LiMn_2O_4$, and $Al_2O_3$ phases from appropriate precursors. This invention is not limited to aforementioned phases. The versatility of the HVS method is demonstrated extensively on two material systems; (1) $Mg(OH)_2+Al_2O_3 \rightleftharpoons MgAl_2O_4+H_2O$, and (2) $CaCO_3+SiO_2 \rightleftharpoons CaSiO_3+CO_2$. It is worthy to note that un-calcined precursors (Hydroxides, Carbonates, etc) are suitable candidates for synthesis work. Overall, HVS can utilize virtually any solid precursor without any preliminary thermal or chemical treatments. To explain the methodology of the synthesis process, the following sections will primarily focus on the synthesis of $CaSiO_3$ from $CaCO_3$ and $SiO_2$ precursors.

Figure 1:
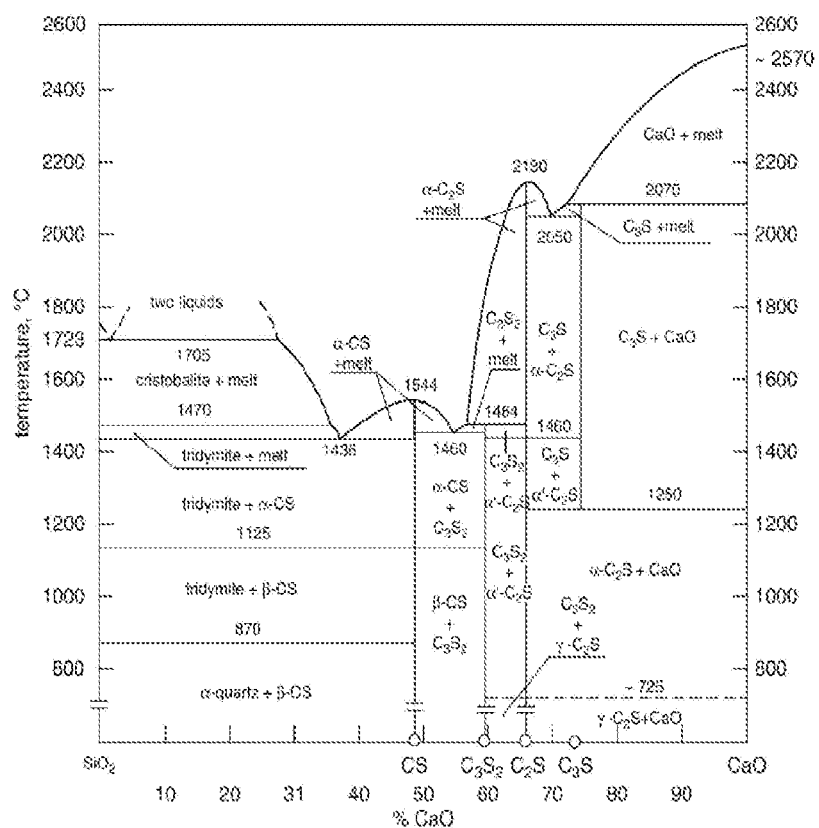
FIG. 1 illustrates the equilibrium phase diagram of the $CaO:SiO_2$ system.

The calcium silicate system ($CaO:SiO_2$) has been extensively studied and explored with a goal for synthesis of cementitious silicates, bio-compatible composites, and fire-resistant materials. Alite ($Ca_3SiO_5$, $C_3S$), Belite ($Ca_2SiO_4$, $C_2S$), Rankinite ($Ca_3Si_2O_7$, $C_3S_2$), and Wollastonite (CaSiO$_3$, CS) are all possible phases that can be synthesized from limestone and silica precursors as shown in FIG. 1. Alite and belite are the core components of today's cement and concrete, while rankinite and wollastonite are being adopted by carbonate cement technology. Other applications, such as biocompatibility and fire-resistivity, also exist for wollastonite and hydrated wollastonite (Xonotlite, $Ca_6Si_6O_{17}(OH)_2$) respectively. The aforementioned applications require uniform batch to batch reproducibility and therefore synthetic phases are typically preferred over any naturally occurring silicates. Specifically, the abundant minerals limestone (Calcite, $CaCO_3$) and quartz ($\alpha$-$SiO_2$).

Solid state, sol-gel, hydro/solvo-thermal, and mechano-chemical techniques have been reported as successful routes in crystallizing phases in this system. All of these methods require temperatures that exceed the decomposition temperature (>650° C.) of limestone and therefore require lime (CaO) for the reaction to occur. For sol-gel and hydro/solvo-thermal techniques, just reaching the decomposition temperature is enough to form a reactive precursor (CaO) which can then be used in low temperature synthesis work. Solid-state reactions on the other hand require even higher temperatures than the decomposition temperature of limestone (>1000° C., FIG. 1) to crystallize a phase. Such high temperature reactions can also result in sintered/fused pellets (clinker) which eventually require energy intensive comminution to be practical for most applications. These temperature and energy requirements combined with a very high demand for product (cement industry) have numerous negative environmental effects; i.e. $CO_2$ contribution and pollution.

CaO or $Ca(OH)_2$ have been used as precursors for hydrothermal synthesis of a calcium silicate phase. Several reports in literature indicate that conducting a solid-state reaction in steam atmosphere reduces the crystallization temperature of the desired phase by 50-150 degrees for both $CaCO_3$ decomposition and $CaSiO_3/Ca_2SiO_4$ crystallization. It is also reported that low-temperature (250-300° C.) hydrothermal reactions involving $CaCO_3$ lead to the formation of various calcium aluminosilicates in the time-frame of 3-6 weeks.

Most recently, $CaSiO_3$ was synthesized from a mixture of $CaCO_3$, $SiO_2$ and NaCl at temperatures as low as 575° C. in a flowing $H_2O$ vapor atmosphere (Kozawa, T., et al, *Chem. Lett.* 38, 476-477 (2009)). However, the Gibb's phase rule limits the versatility of these techniques since reaction-pressure is only adjustable by changing the temperature (hydrothermal) or is held constant (flowing $H_2O$ vapor atmosphere).

Furthermore, any reaction that would occur in the liquid phase hydrothermal ($H_2O$ liquid and gas coexist, LPH) mode would be difficult to control since the evolved $CO_2$ in the liquid water would never hit a critical level to limit Xonotlite formation. Therefore, a reaction performed under LPH conditions for the synthesis of wollastonite may be abandoned since the only phase formed could be Xonotlite. Influence of other phases may also interfere with program development, since a carbonated and hydrated calcium silicate phase also exists.

By simply using intuitive or empirical reaction knowledge to define experiments, such as LPH or VPH, the discovery of the reaction conditions to make a targeted phase would be unlikely. This is shown in the patent literature where experiments in the liquid phase (LPH) yield xonotlite but not wollastonite. These results would inform an empiricist to move to supercritical conditions, which would prevent discovery of the low-temperature and pressure conditions suitable for products of the $CaCO_3+SiO_2$ reaction. Furthermore, traditional texts on thermodynamics do not instruct someone of ordinary skill how to properly calculate pressure as a function of temperature for the case of water. Thus, a reactor leak, an un-calibrated balance, or excess $H_2O$ inherent in the reactant powders would be unrecognizable and therefore an investigator would have a difficult time distinguishing an experiment performed at equilibrium conditions versus a system that is either not at equilibrium or one that was done incorrectly.

The methods of the present invention allow for convenient and efficient manipulation of pressure and temperature and can be utilized in the synthesis of materials such as scawtite, wollastonite, xonotlite, and quartz.

All hydrothermal literature involving calcium silicate synthesis revolves around the synthesis of the hydrated phase, xonotlite, from CaO and $SiO_2$ precursors instead of $CaCO_3$ and $SiO_2$. In the case of HVS, the present invention is not limited to calcined precursors and can accurately model the effect of evolved $CO_2$ will have on the reaction. For example, submerging the $CaCO_3$ and $SiO_2$ precursors into water under high temperature (>350° C.) LPH conditions would impose complicated thermodynamic calculations due to solubility, pH, and higher pressure considerations. Furthermore, any reaction that would occur in the LPH mode would behave and interact differently than HVS since the evolved $CO_2$ in the liquid water would never hit a critical level to limit Xonotlite formation. Therefore, if a similar reaction was performed under LPH conditions for the synthesis of wollastonite, the program may be abandoned since the only phase formed could be Xonotlite. Influence of other phases may also interfere with program development, since a carbonated and hydrated calcium silicate phase also exists; Scawtite, $Ca_7Si_6(CO_3)O_{18}\cdot 2(H_2O)$.

The following non-exclusive list of materials can be synthesized according to the HVS method of the present invention:
1. $MgAl_2O_4$
2. $Mg_6Al_2CO_3(OH)_{16}*4H_2O$
3. $CaSiO_3$
4. $Ca_6Si_6O_{17}(OH)_2$
5. $Ca_7Si_6CO_3O_{18}\cdot 2(H_2O)$
6. $2Y_3Al_5O_{12}$
7. $SrZrO_3$
8. $ZnAl_2O_4$
9. $CaTiO_3$
10. $Ba_2Ti_9O_{20}$
11. $LiMn_2O_4$
12. $Li_2MnO_3$
13. $Co_3O_4$
14. $LiCoO_2$
15. $Y_2Ti_2O_7$
16. $Li_2Mn_2O_3$
17. $LiV_3O_8$ Other multi-cation compounds include but are not limited to magnesium silicate, calcium-magnesium silicate, all oxides containing one or more alkaline earth cations combined with any suitable cation, all oxides containing aluminum ions in combination with any suitable ion, and all oxides that contain silicon and any suitable ion.

Throughout this patent document, various publications are referenced. The disclosures of these publications in their entireties are hereby incorporated by reference into this application in order to more fully describe the state of the art to which the disclosed matter pertains. While the following text may reference or exemplify specific elements of a composite or a method of utilizing the composite, it is not intended to limit the scope of the invention to such particular reference or examples. Various modifications may be made by those skilled in the art, in view of practical and economic considerations, such as the temperature and pressure of the reaction conditions and the ratio between the calcium and silicon precursors.

The articles "a" and "an" as used herein refers to "one or more" or "at least one," unless otherwise indicated. That is, reference to any element or component of the present invention by the indefinite article "a" or "an" does not exclude the possibility that more than one element or component is present.

The term "about" as used herein refers to the referenced numeric indication plus or minus 10% of that referenced numeric indication.

The terms "vapor" and "gas" are used interchangeably throughout this document. When referring to the solvothermal or hydrothermal vapor atmosphere, this means the vapor is unsaturated gas.

The term reaction catalyst as used herein refers to a material (liquid, solid, gas, ionic, or supercritical) that is added to the raw material mixture prior to or during the reaction. The catalyst typically does not change the thermodynamics of the reaction system, but does typically change the reaction rate (faster or slower).

The term "precursor" as used herein refers to any material leading to the formation of the target product. A precursor may be in the form of a solid, liquid, gas, ionic, or supercritical species. Examples of solid precursors include metals (Aluminum, Iron, Cobalt, Copper, Zinc, Magnesium, Titanium etc.), ceramics (carbonates, hydroxides, oxides, carbides, bromides, borides, nitrides, fluorides, iodides, arsenides, selenides, phosphides, sulfides, tellurides, hydrides, etc.). Additional examples for Oxides includes MgO, $Al_2O_3$, CaO, and $Mn_2O_3$. Additional examples for Hydroxides include $Mg(OH)_2$, $Al(OH)_3$, AlO(OH), $Ba(OH)_2$. Additional examples for Carbonates include $MgCO_3$, $CaCO_3$, $BaCO_3$, and $Na_2CO_3$. Additional examples for Nitrides include $Si_3N_4$, $Mg_3N_2$, $(AlN)_x\cdot(Al_2O_3)_{1-x}$. Additional examples for Carbides include SiC, $B_4C$, WC, $MgC_2$, and $CaC_2$. A material or precursor may be in a liquid state.

Examples include inorganic materials (MgO (l), NaCl (l), H$_2$O (l), NaCl—KCl (Eutectics), Ga(l), and NH$_3$ (l), etc.) and organic materials (C$_2$H$_6$O$_2$ (Ethylene Glycol), C$_4$H$_6$O$_3$ (Propylene Carbonate), (Methanol), C$_2$H$_5$OH (Ethanol), C$_3$H$_7$OH (isopropanol), etc.). A material may be an inorganic gas (e.g. CO$_2$, H$_2$O, N$_2$, Cl$_2$, F$_2$, NH$_3$) or an organic gas (CH$_2$O (Formaldehyde), CHCl$_3$ (Chloroform)). An ionic material may be inorganic (containing for example H+, OH−, Ca$_2$+, Mg$_2$+, Na+, Cl−, K+, NH$_4$+) or organic (containing for example CH$_3$COO— (Acetate), HCOO— (Formate) or CN— (Cyanide)). A supercritical material may also be inorganic (for example CO$_2$, CH$_4$, N$_2$O, NH$_3$, N$_2$) or organic (e.g. C$_2$H$_5$OH (Ethanol), CH$_3$OH (Methanol), C$_3$H$_6$O (Acetone)).

The term "solvothermal Vapor Synthesis" (SVS) refers to a method for facilitating the crystallization of a phase from a mixture of selected inorganic or organic precursors in a gaseous solvent reaction medium (subcritical). By adjusting the temperature and the partial pressures of the solvent and monitoring any relevant partial pressures of other gasses, phases can be selectively partitioned out. In the case of water being the solvent, the reaction method is labeled "Hydrothermal Vapor Synthesis" (HVS). The role of the gaseous solvent is to enhance the kinetics of a thermodynamically favorable reaction system. In some cases, the gaseous solvent could participate in the thermodynamics of a reaction (e.g. 6CaCO$_3$+6SiO$_2$+H$_2$O⇌Ca$_6$Si$_6$O$_{17}$(OH)$_2$+CO$_2$ in unsaturated gaseous H$_2$O (g)). The departure temperature point at which the liquid-phase no longer exists, may be important in optimizing the reactivity of several systems. This temperature can be changed by modifying the solvent with addition of various solute or increasing/reducing vessel liquid fill fraction. The solvent phase is generally in the form of a subcritical unsaturated gaseous phase. SVS should be substantially free from liquid-phase in the reaction zone. In any SVS reaction, the main reaction medium (e.g., water, acetone, ammonia) is in the subcritical gaseous regime. For example, if the solvent is pure H$_2$O, the pressure cannot exceed 22.06 MPa (3199.308 psi) at temperatures >374° C. (In the case of pure NH$_3$, the pressure cannot exceed 11.3 MPa (1638.6 psi) at temperatures >132° C. In all cases, the reaction medium is unsaturated gas, meaning no liquid-phase is present in the reaction zone. Examples of solvent in SVS include water, ammonia, ethanol, methanol, acetone, toluene and benzene. Additional gaseous vapors might be introduced (precursor, or catalyst) to enhance the reaction.

The term "hydrothermal Vapor Synthesis" (HVS) refers to a new method for facilitating the crystallization of a phase from a mixture of selected inorganic or organic precursors in a water vapor-phase reaction medium. By adjusting the temperature and the partial pressures of water and monitoring any relevant partial pressures of other gasses (e.g., CO$_2$), phases can be selectively partitioned out. The reaction generally proceeds at a temperature above 100° C. with higher than 1 atm psig pressure and the water is in the vapor phase (unsaturated vapor).

The terms "vapor" and "gas" are used interchangeably throughout this document. When referring to the solvothermal or hydrothermal vapor atmosphere, this means the vapor is unsaturated gas.

The term "liquid" refers to a material that is above its melting temperature and pressure, but below its boiling temperature and pressure.

The term "gas" refers to a material that is above its boiling temperature and pressure, but below its supercritical temperature and pressure.

The term "ionic material" refers to a material that has undergone speciation into its elemental components. The ionic material may be complexed by the solvent.

The term "supercritical material" refers to a material that has exceeded its supercritical temperature and pressure.

The term "inorganic material" or "inorganic reaction product" refers to a material represented by the formula $A_a B_b C_c Z_z Y_y X_x (\alpha)_f (\beta)_g (\gamma)_h \cdot i(\delta) \cdot j(\varepsilon) \cdot k(\theta)$, wherein A, B, C are single or multi-elemental cations, Z, Y, X are single or multi-elemental anions, α, β, γ are charged molecules, and δ, ε, θ are neutral molecules. The material can be either crystalline (ordered), amorphous (disordered), or a mixture of both. (A), (B), and (C) can comprise of a single or multi elemental cation (positively charged alkali, alkali-earth, transition metal, semi-metal, non-metal, halogen, noble gas, lanthanide, or actinide species) with a concentration of [a], [b], and [c] between ppb (parts per billion) and 100%. (Z), (Y), and (X) can comprise a suitable single or multi elemental anion (negatively charged elemental species, e.g., Oxygen, nitrogen, carbon, fluorine, chlorine, etc) with a concentration of [Z], [Y], and [X] between ppb and 100%. (α), (β), and (γ) can comprise of a variety of charged molecules and ligand groups (organic or/and inorganic) with concentrations of [f], [g], and [h] between ppb and 100%. These molecules could be positively or negatively charged (e.g. OH$^-$, CO$_3^-$, NH$_4^+$, NR$_4^+$). (δ), (ε), and (θ) can comprise of a variety of neutral molecules and ligand groups (e.g., H$_2$O) with concentrations of [i], [j], and [k] between ppb and 100%.

The term "standard-state pressure" refers to a system pressure equal to 1 atm.

The term "non standard-state pressure" refers to a system pressure above or below 1 atm.

The term "non-standard state change in Gibb's free energy" refers to a change in Gibb's free energy associated with the formation of a reaction product at a system pressure above or below 1 atm.

The term "system pressure" refers to the total pressure exerted on the system by gases present in the system. The total pressure includes the partial pressures of each gas present. For ideal cases, the total pressure is the summation of the partial pressures of each gas present.

The following abbreviations are used: HVS: Hydrothermal Vapor Synthesis; LPH: Liquid-phase hydrothermal; VPH: Vapor-phase hydrothermal; SCW: Supercritical water.

Unlike LPH, VPH, and SCW synthesis, HVS is conducted at any temperature (>100° C.) and pressure where liquid water no longer exists. The pressurized water vapor atmosphere acts as a reaction catalyst for the synthesis of inorganic materials at relatively low temperatures (<500° C.). This means that HVS enhances the kinetics of a thermodynamically favorable reaction between the selected precursors. Specifically, the main equation governing whether a reaction between precursors is thermodynamically favorable is the Gibb's free energy of reaction:

$$\Delta G°_{rxn} = \Sigma \Delta G_{f_{products}} - \Sigma \Delta G_{f_{reactants}}$$

If the $\Delta G°_{rxn}$ is negative, positive, or zero, then the reaction will proceed, not proceed, or remain in equilibrium respectively. The "°" refers to standard state conditions: i.e., Total Pressure=1 atm. The pressure increase inside a hydrothermal vessel is dictated by the water liquid-vapor equilibrium curve and also by any volatile substance that could be adding gaseous products to the mix. Accordingly, any gaseous reactant or product can also contribute to the overall thermodynamics of the reaction system via the following non-standard-state relationship:

$$\Delta G_{total} = \Delta G_{rxn}^o + RT\ln(K)$$

$$K = \frac{[\text{products}]}{[\text{reactants}]} = \frac{[a_{p(s)} a_{p(g)}]}{[a_{r(s)} a_{r(g)}]} = \frac{P_p}{P_r}$$

where R is the molar gas constant (8.314 J/mol·K), T is the temperature (Kelvin), K is the reaction equilibrium constant, a is the activity component of the reactants and products, and P is the partial pressure (atm) of the present gases (Subscripts p=product, r=reactant, s=solid, g=gas). If the $\Delta G_{total}$ (non standard-state change in Gibb's free energy for a particular reaction) is negative, positive, or zero, then the reaction will proceed, not proceed, or remain in equilibrium respectively. The present disclosure details how to apply the thermodynamics of a system in the solvothermal vapor environment to predict product formation. In particular, one or more of the temperature, unsaturated vapor pressure, and partial pressure of any gases added or produced are selected to reduce the non-standard state change in Gibb's free energy of the reaction system to less than or equal to zero. In some embodiments, the non-standard state change in Gibb's free energy of the reaction system may be equal to zero, reduced to below zero, or below −10, or below −100, or below −1,000 kJ/mol. In some embodiments, the non-standard state change in Gibb's free energy may be reduced down to −10,000 kJ/mol. The non-standard state change in Gibb's free energy may also be reduced by the addition of a gaseous, liquid, or solid species, or by the production of a gaseous, liquid, or solid species within the reaction system. The non-standard state change in Gibb's free energy may also be reduced by removal of any of these species from the reaction system.

The solvothermal method deviates from the liquid-vapor equilibrium by eliminating the vessel liquid volume fraction. The utilization of unsaturated vapor increases the versatility of this process by introducing another synthesis variable and one additional degree of freedom; where any pressure (P) can be selected at a given temperature by control of the amount of reaction medium added to the vessel. Tuning this variable can optimize reaction kinetics, phase-purity, crystallite size, and morphology.

In the case of water being the reaction medium, the reaction method is labeled "Hydrothermal Vapor Synthesis." However, methods of the present disclosure may utilize other reaction mediums such as organic or inorganic species, or mixtures thereof. In some embodiments, the reaction medium may be one or more of ammonia, ethanol, methanol, acetone, toluene and benzene. If the reaction medium comprises more than one species, then at least one the species may in an unsaturated vapor state at the temperature and pressure of the reaction conditions. In some embodiments, the other species may be saturated, subcritical, or critical pressures.

The precursors utilized can be crystalline, amorphous, liquid, or aqueous. The precursors may be well-mixed to ensure a high degree of reaction completion. Precursor mixtures are suspended above or dispersed in the water residing in the reactor prior to the beginning of the reaction. Each material system will dictate the pressure and therefore liquid fill percent necessary for reaction to proceed.

The reactions observed in the $CaO:SiO_2:CO_2:H_2O$ system are excellent examples of the capabilities of HVS. The wollastonite ($CaCO_3 + SiO_2 \rightleftharpoons CaSiO_3 + CO_2$) and the xonotlite ($6CaCO_3 + 6SiO_2 + H_2O \rightleftharpoons Ca_6Si_6O_{17}(OH)_2 + 6CO_2$) reaction systems will be explored in this case-study. The wollastonite system will showcase how HVS affects the kinetics of a reaction, while the Xonotlite system will showcase how HVS can participate in the thermodynamics. To summarize, solid-state thermodynamics state that at 1 atm of $CO_2$ (wollastonite) and 1 atm of $H_2O$ (xonotlite), the wollastonite and xonotlite reactions are only favorable at temperatures greater than 285 and 455° C. respectively.

Figure 11:
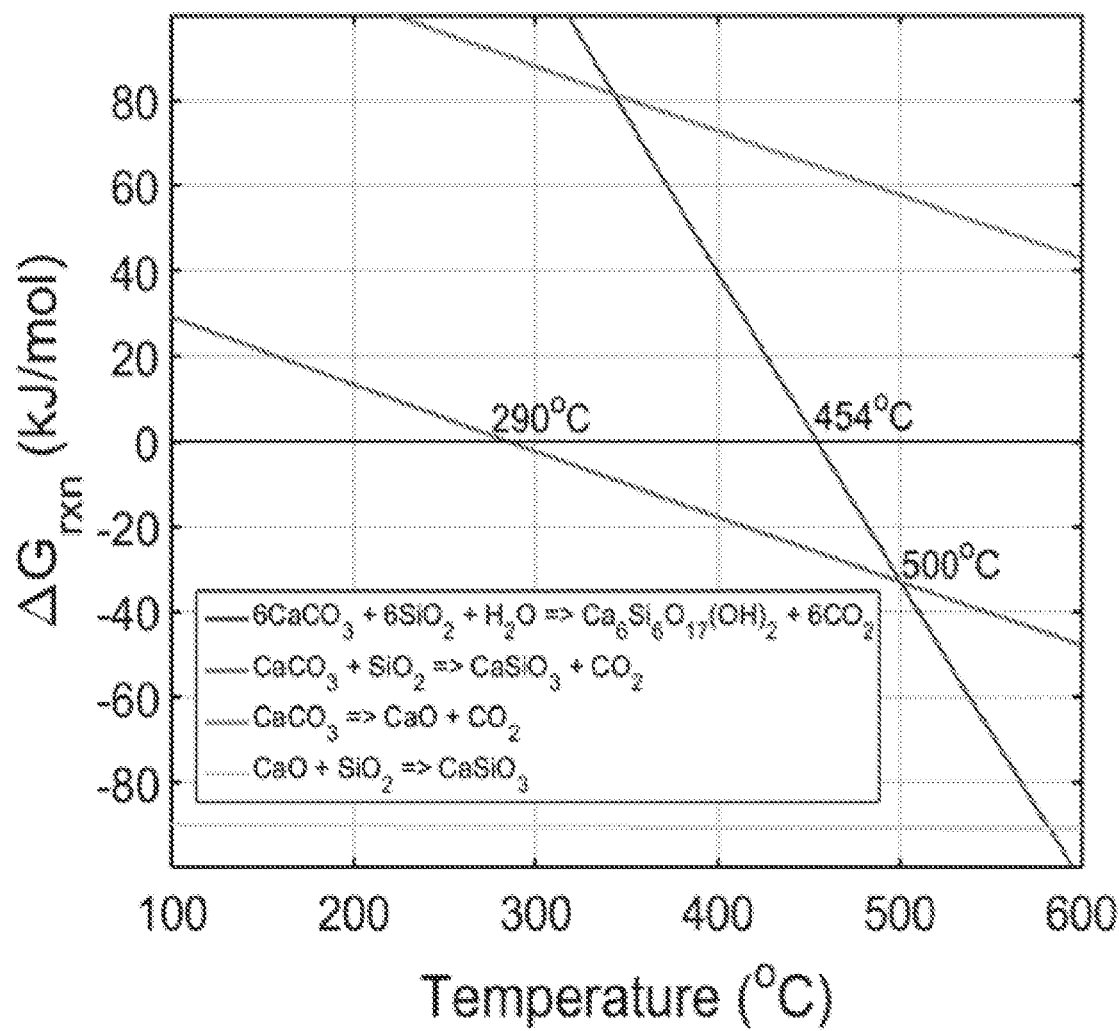
FIG. 11 illustrates the equilibrium thermodynamic calculations of the $CaSiO_3$ and $Ca_6Si_6O_{17}(OH)_2$ crystallization reactions from $CaO/CaCO_3$ and $SiO_2$ precursors.
Figure 12:
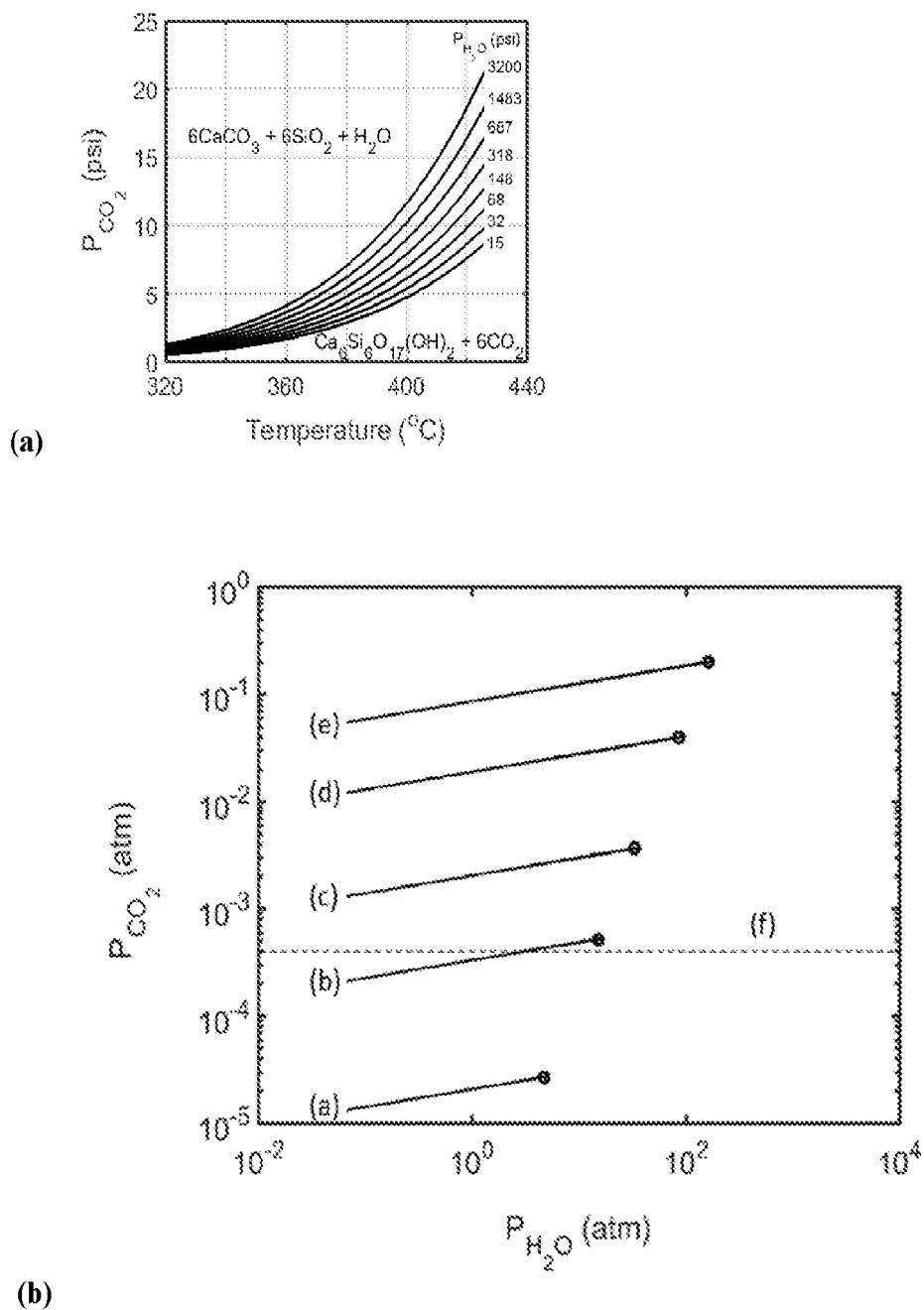
FIG. 12 illustrates (a) equilibrium phase diagram of the $6CaCO_3+6SiO_2+H_2O \rightleftharpoons Ca_6Si_6O_{17}(OH)_2+6CO_2$ reaction in a broad range of temperature and $CO_2$ partial pressures at various $H_2O$ partial pressures. (b) equilibrium relationship between $P_{H2O}$ and $P_{CO2}$ for reaction in (a) at various temperatures.
Figure 13:
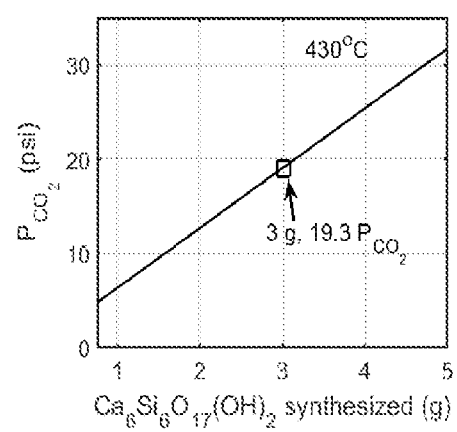
FIG. 13 illustrates non-thermodynamic equilibrium computation of the $CO_2$ partial pressure produced from a $6CaCO_3+6SiO_2 \rightleftharpoons Ca_6Si_6O_{17}(OH)_2+6CO_2$ reaction in a 1-L batch reactor.

Once the pressures for the respective reaction systems are elevated above 1 atm, thorough equilibrium calculations need to be invoked. Specifically, the intersection between the $CaCO_3 + SiO_2 \rightleftharpoons CaSiO_3 + CO_2$ and the $\Delta G=0$ line will shift to higher temperatures with increasing $CO_2$ partial pressures. The $6CaCO_3 + 6SiO_2 + H_2O \rightleftharpoons Ca_6Si_6O_{17}(OH)_2 + 6CO_2$ reaction is slightly more complicated since $H_2O$ partial pressures have to be taken into account. FIGS. 11-13 address all of the thermodynamic considerations that are necessary to adequately identify the temperature-pressure regimes where these phases exist. Without this knowledge, it will not be easy to identify kinetically-controlled regimes from ones thermodynamically controlled.

The partial pressure of water throughout the reaction is pre-selected by adjusting the reactor fill %. Intuitively, xonotlite would be the expected phase when combining $CaCO_3$, $SiO_2$, and $H_2O$. It can be clearly seen that at both 350 and 430° C. the $CO_2$ partial pressures that would inhibit reaction are so low (<20 psi, at 430° C. and 1000 psi $P_{H2O}$, and <4 psi at 350° C. and 1000 psi $P_{H2O}$), that no application for scale-up would ever be considered. The resulting $CO_2$ in any reaction involving more than several grams of powder would be large enough to put the reaction into equilibrium and therefore inhibit reaction progression in a batch-style reactor (closed system). Furthermore, the stability of xonotlite relative to its anhydrous phase (wollastonite) should be addressed in a water vapor atmosphere. To summarize, unrealistically high partial pressures of $H_2O$ (>$10^{12}$ psi) are necessary to stabilize xonotlite across most temperatures and therefore any synthesized xonotlite will always try to decompose into wollastonite.

The next thermodynamic calculation addresses wollastonite carbonation. The $CaCO_3 + SiO_2 \rightleftharpoons CaSiO_3 + CO_2$ equilibrium system indicates that appreciable partial pressures (>646 psi) of $CO_2$ are necessary to stop and reverse the reaction at 430° C. Furthermore, a quick calculation reveals that a $P_{CO2}$ value of 646 psi in a 1-L batch reactor would result in 100 grams of wollastonite before a reaction reversal would begin to occur. Any further reaction above the already synthesized 100 grams would not occur in a 1-L closed system.

By simply using intuitive or empirical reaction knowledge to define experiments, such as LPH or VPH, the discovery of the reaction conditions to make a targeted phase would be unlikely. This is shown in the patent literature where experiments in the liquid phase (LPH) yield xonotlite but not wollastonite. These results would inform an empiricist to move to supercritical conditions, which would prevent discovery of the low-temperature and pressure conditions suitable for products of the $CaCO_3 + SiO_2$ reaction. Furthermore, traditional texts on thermodynamics do not instruct someone of ordinary skill how to properly calculate pressure as a function of temperature for the case of water. Thus, a reactor leak, an un-calibrated balance, or excess $H_2O$ inherent in the reactant powders would be unrecognizable and therefore an investigator would have a difficult time distinguishing an experiment performed at equilibrium conditions versus a system that is either not at equilibrium or one that was done incorrectly.

Specifically, all hydrothermal literature involving calcium silicate synthesis revolves around the synthesis of the hydrated phase, xonotlite, from CaO and $SiO_2$ precursors instead of $CaCO_3$ and $SiO_2$. In the case of HVS, we are not limited to calcined precursors and can accurately model the effect of evolved $CO_2$ will have on the reaction. Submerging the $CaCO_3$ and $SiO_2$ precursors into water under high temperature (>350° C.) LPH conditions would impose complicated thermodynamic calculations due to solubility, pH, and higher pressure considerations. Furthermore, any reaction that would occur in the LPH mode would behave and interact differently than HVS since the evolved $CO_2$ in the liquid water would never hit a critical level to limit Xonotlite formation. Therefore, if a similar reaction was performed under LPH conditions for the synthesis of wollastonite, the program may be abandoned since the only phase formed could be Xonotlite. Influence of other phases may also interfere with program development, since a carbonated and hydrated calcium silicate phase also exists; Scawtite, $Ca_7Si_6(CO_3)O_{18}.2(H_2O)$.

HVS is thus a new synthetic method where low pressure reactions can be engineered provided the reaction thermodynamics can be calculated for the solid—water vapor equilibria. These calculations enable systematic selection of the processing variables that include vessel volume, mass of solid component, amount of water and temperature. With exposure to advanced models that enable calculation of water partial pressure, Ellingham diagram for all possible phases, and the kinetic role of water, it would not be possible to systematically set-up experiments where variable space is properly investigated. Without this knowledge and instrumentation that monitors pressure continuously, both model validation and leak detection would not be possible. These technical issues thwart an investigator from being able to perform experiments involving a simple grid of systematic variable both in terms of achieving the targeted conditions but also knowing the range of reaction conditions that define where the desired product can form.

There are several considerations that make the HVS method possible and unique: (1) Adequate understanding of pressure control within an autoclave and (2) Thermodynamic understanding of reaction between selected precursors. The following section outlines both.

The complexity of HVS resides in fully understanding the water liquid-vapor phase equilibrium and the relationship between temperature (T), pressure (P), volume (V), and concentration (n) for non-ideal gasses. Accurate data for the water liquid-vapor equilibrium, e.g., from IAWPS (International Association for the Properties of Water and Steam), may be helpful in designing hydrothermal reactions (LPH, VPH, and SCW). To eliminate the liquid phase within an autoclave, equations that govern the relationship between T, P, V, and n are: (1) Ideal gas Law, (2) Vander-waals equation, and the (3) Redlich-Kwong equation. These equations are designed to predict the pressure increase of a gas, with (2) and (3) taking into account non-ideal gas behavior. By simply utilizing (1), an incorrect calculation that doesn't take into the proportionality constants associated with gaseous $H_2O$ would occur. The differences between (1), (2) and (3) can be identified for the following temperatures: 400, 374, 350, and 250° C. In each case, the ideal gas law fails to determine the correct pressure increase within the reactor at fill %'s >2.5. Once the pressure at a pre-determined fill % is determined, then the water liquid-vapor phase equilibrium may be considered to ensure that the set temperature and resulting pressure create a single vapor phase as opposed to a coexistent vapor-liquid system. Knowing this methodology is critical; otherwise the investigator will be unable to distinguish a reactor leakage problem from non-ideal gas behavior.

In some embodiments, the reaction vessel may be a batch, continuous, semi-batch, or semi-continuous reaction vessel. Where a continuous, semi-continuous, or semi-batch reaction vessel is used, unreacted reactants may be removed and recycled back into the reaction vessel.

One aspect of the invention provides a method of synthesizing a compound of a formula $Ca_aSi_bO_c(CO_3)_d(OH)_e$, wherein a, b, and c are each a value greater than 0, and d and e are each equal or greater than 0, comprising:

(a) suspending a composition comprising a silicon source and a calcium oxide source above liquid water in a sealed reaction vessel or dispersing the composition in the liquid water, said liquid water filling about 0.1% or more of said vessel;

(b) heating the reaction vessel so that the inside of the vessel reaches a temperature of between about 101 to 1000° C., wherein the water exists only in gaseous state after the desirable temperature is reached.

A variety of calcium inosilicate minerals or related compounds including scawtite, xonotlite, wollastonite, alite, and belite can be represented by formula I of $Ca_aSi_bO_c(CO_3)_d(OH)_e$. In some embodiments, a, b, and c are each greater than 0, and d and e are each equal or greater than 0. In some embodiments, formula I is represented by formula Ia of $Ca_aSi_bO_c.(H_2O)_f$, wherein f is a value equal or greater than 0 In some embodiments, formula I is represented by formula Ib of $Ca_aSi_bO_c$. In some embodiments of formula Ia and Ib, a+2b=c. In some embodiments, the values of a, b and c are independently selected from 1, 2, 3, 4, 5, 6, 7, 8, 9 and 10. In some embodiments, the values of d, e and f are independently selected from 0, 1, 2, 3, 4, 5, 6, 7, 8, 9 and 10. Non-limiting examples of compounds under the formula include Xonotlite ($Ca_6Si_6O_{17}(OH)_2$), Scawtite ($Ca_7Si_6O_{18}(CO_3).2(H_2O)$), wollastonite ($CaSiO_3$), belite ($Ca_2SiO_4$), and alite ($Ca_3SiO_5$).

Figure 4:
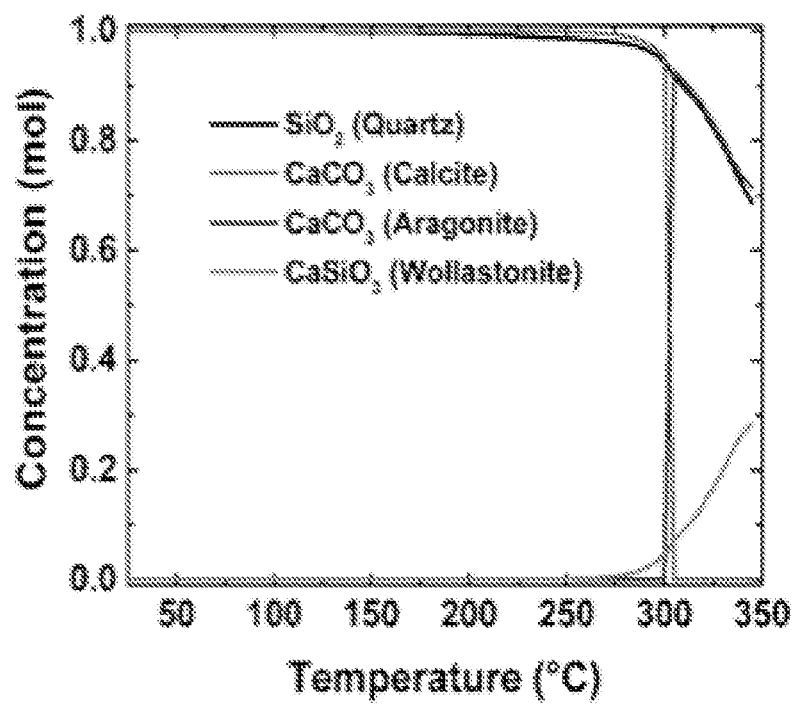
FIG. 4 illustrates the OLI thermodynamic simulations of the reaction between 1 mol of $CaCO_3$ and $SiO_2$ at Pressure=200 atm, and 1 kg of water. (a) Solids-yield calculation of $CaSiO_3$ formation (b) Generated chemical diagram (OLI Analyzer Studio 9.1.
Figure 4:
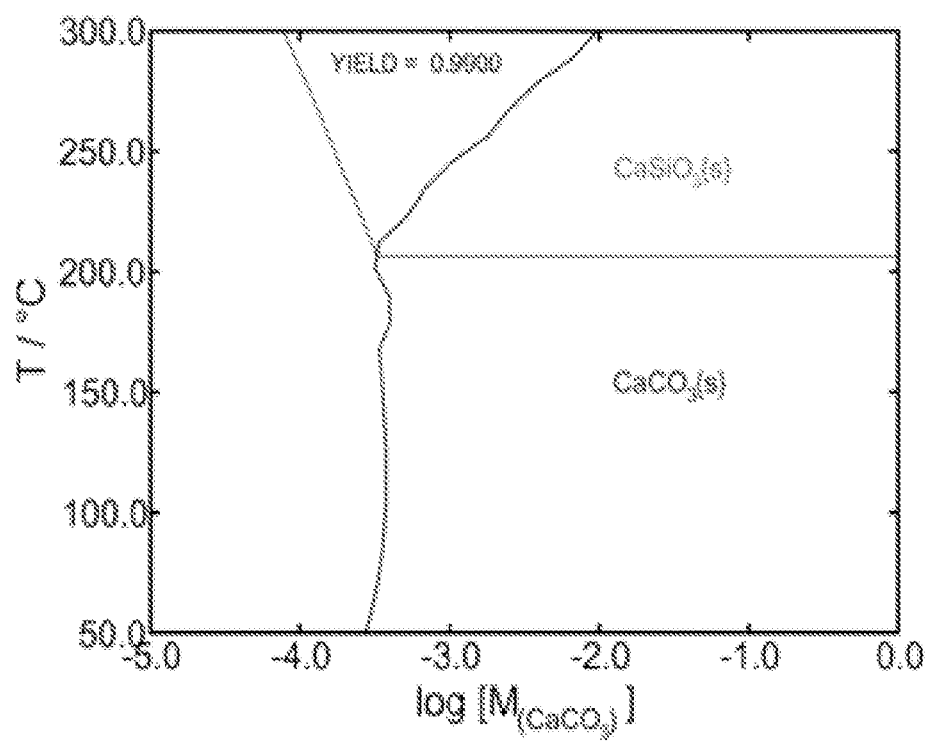

The pressure of the reaction directly impacts the composition of the final product. As illustrated in FIG. 4, different product phases are formed at different pressures. In general, higher pressures lead to the formation of carbonate phases, while lower pressures result in anhydrous and hydrous calcium silicates. Reducing the pressure can yield new phases, change kinetics, and allow for a low-cost reactor options for lab and pilot plant scales. The "all-steam" reaction medium also eliminates the need for complicated liquid solution solubility calculations to determine stability versus reactivity.

Figure 3:
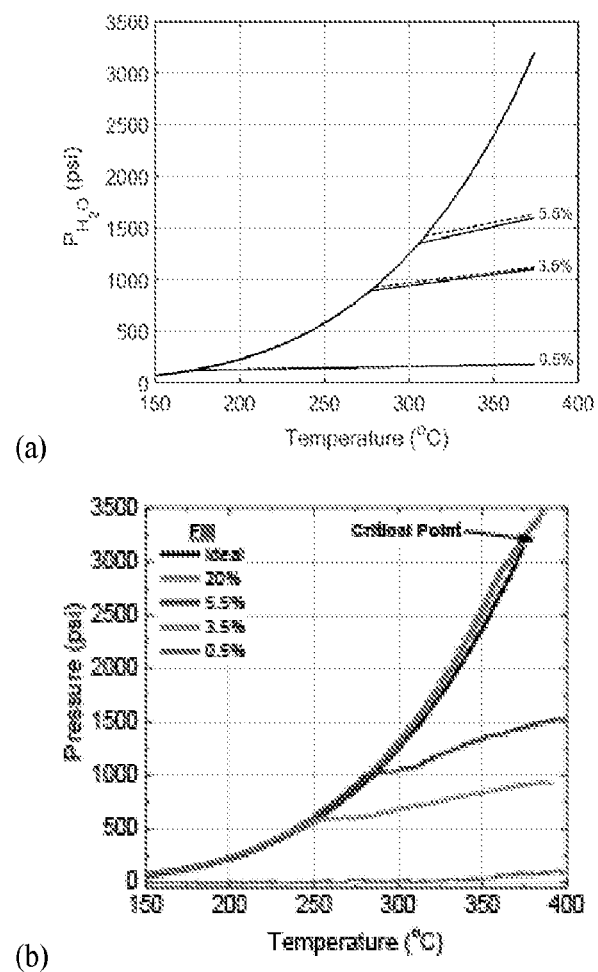
FIG. 3 illustrates (a) numerically and (b) experimentally obtained temperature-pressure profiles at pre-determined liquid fill-fraction.

The pressure of the reaction condition can be tuned by varying the amount of water in the vessel. The amount of water can be determined prior to the reaction. Alternatively, the water content can be changed during the reaction. The amount and/or frequency in the change of water content depends on factors such as the composition of the target product, the precursors of calcium and silicon, and the temperature of the reaction and can be readily determined by one of ordinary skill in the art without undue experiments. FIG. 3 is an exemplary illustration of the relationship between the amount of water and the pressure in the vessel. It is observed that the pressure rises with increasing amount of water and temperature.

Figure 19:
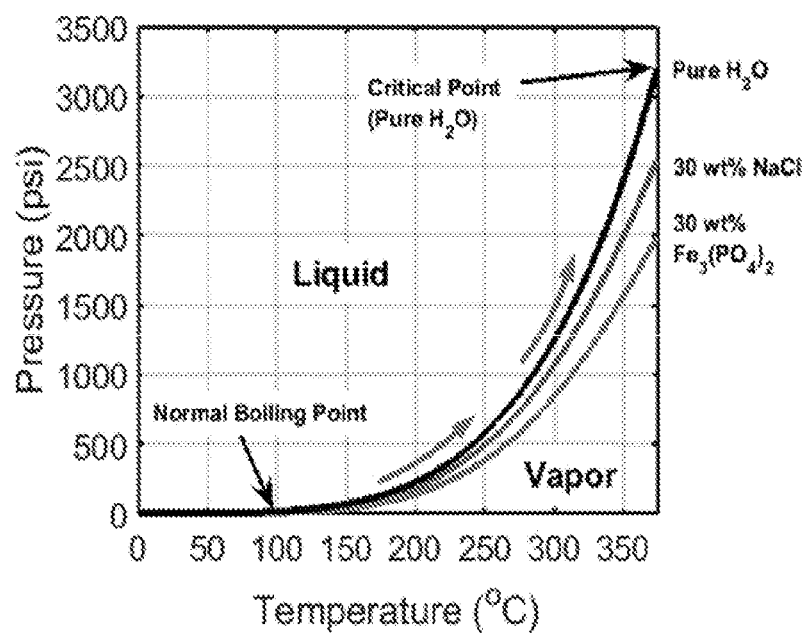
FIG. 19 illustrates how addition of solute can shift the water liquid-vapor phase equilibrium to higher temperatures.
Figure 20A:
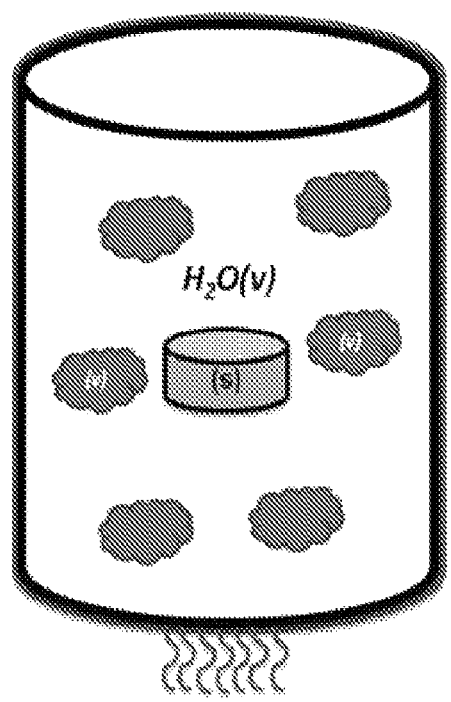
FIG. 20 illustrates a (a) schematic of autoclave configuration and (b) the water liquid-vapor equilibrium diagram for the Hydrothermal Vapor Synthesis method (red-lines and "x" indicate arrows indicate pressure and temperature parameters for an "all-vapor" hydrothermal reaction). The departure temperature is defined as the point where LPH/VPH transforms into HVS. This point can be altered based on solute additions.
Figure 20B:
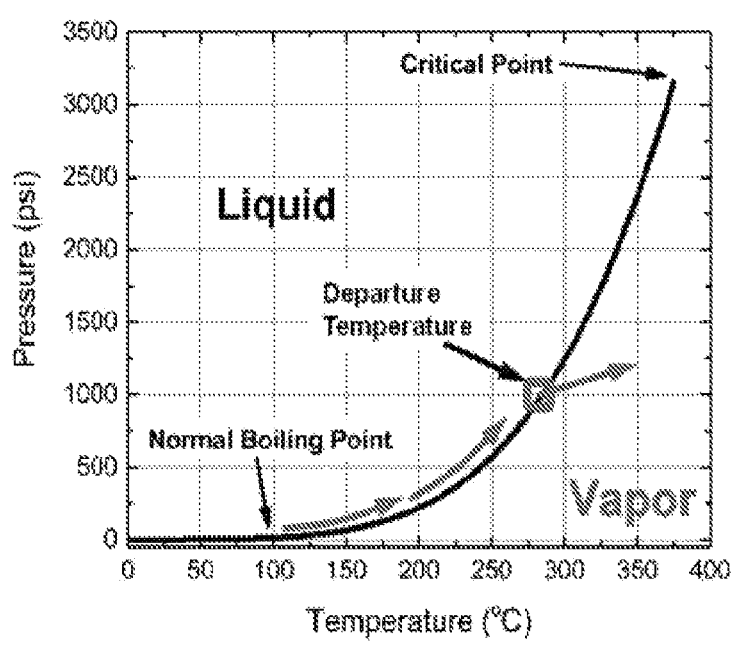

Addition of a solute to the liquid water can shift the water liquid-vapor equilibrium to higher temperatures and thus modify the HVS "departure temperature" (FIG. 19). The solute (a variety water soluble-compounds) can elevate the boiling point of water and therefore shift the water liquid-vapor phase equillibirum to higher temperatures. The shift depends on the amount of dissociation and speciation and therefore differs across a range of soluble compounds. A several degree shift becomes very prominent at temperatures between 250° C. and 374° C. (supercritical point of water), since in this range the pressure increases exponentially. This solute addition changes the temperature (departure temperature, FIG. 20b) at which the hydrothermal environment changes into HVS. This allows for greater control of the departure temperature and therefore reaction pressure.

Solute is chosen based on the desired final pressure at final temperature. Literature can be surveyed to select a solute. Numerical calculations could also be used to predict the final pressure for a given solute:

$$\Delta T = i * K_b * m$$

$$K_b = \frac{RT_b^2}{1000L_v}$$

Where $\Delta T$ is the temperature shift of the vapor pressure curve, i is the Vant Hoff factor that is unique for a given solute, m is the molality, R is the molar gas constant, $T_b$ is the boiling point of the solvent, $L_v$ is the vaporization energy at a given temperature, and Kb is the ebullioscopic constant. Therefore, any pressure calculation may take into account the water liquid-vapor equilibrium curve from The International Association for the Properties of Water and Steam (IAPWS). The $\Delta T$ values calculated from the above expressions are simply added to the vapor pressure curve to depict the shift (FIG. 19).

Determining the relationship between liquid fill % and the resulting pressure can be computed numerically and confirmed experimentally. This is a key approach in determining whether the reactor is properly sealed. Several equations of state models exist in literature that relate the pressure, temperature, volume, and concentration of a gas: Ideal gas law, Vander-Waals equation, and the Redlich-Kwong equation. These equations can be used to predict the resulting pressure within a vessel. Since these equations are meant for gases, they can only be applied to the vapor-phase of the hydrothermal portion. Therefore, any pressure calculation may take into account the water liquid-vapor equilibrium curve to ensure that only a gas phase region exists (no equilibrium phase coexistence). Temperature and pressure values for the water liquid-vapor equilibrium data were obtained from The International Association for the Properties of Water and Steam (IAPWS). The Vander-waals and Redlich-Kwong equations better represent actual experimental data, since both equations take into account compressibility and expansion parameters of water vapor.

Ideal Gas Law Equation
The most basic relationship between Pressure, Volume, Temperature, and concentration of an ideal gas.

$$PV = nRT$$

where P is the pressure (atm), V is the volume (liters), T is the temperature (K), n is the quantity of water (moles), R is the molar gas constant (0.0821 L·atm/mol·K).

Vander-Waals Equation
The Vander-Waals equation was used to calculate the resulting pressure:

$$\left(P + \frac{n^2 a}{V^2}\right)(V - nb) = nRT$$

where P is the pressure (atm), V is the volume (liters), T is the temperature (K), n is the quantity of water (moles), R is the molar gas constant (8.314 J/mol·K), and a and b are the proportionality constants (a=5.46 atm·L$^2$/mol$^2$ and b=0.0305 L/mol for $H_2O$).

Redlich-Kwong Equation
The Redlich-Kwong equation was used to calculate the resulting pressure:

$$P = \frac{RT}{V_m - b} - \frac{a}{T^{\frac{1}{2}} V_m (V_m + b)}$$

$$a = \frac{0.4275 R^2 T_c^{\frac{5}{2}}}{P_c}$$

$$b = \frac{0.08664 * R * T_c}{P_c}$$

where P is the pressure (atm), $V_m$ is the molar volume (L/mol), T is the temperature (K), R is the molar gas constant (8.314 J/mol·K), a is the constant that corrects for attraction and potential of molecules, b is the constant that corrects for volume, $T_c$ is the temperature at the critical point, and $P_c$ is the pressure at the critical point.

The pressures derived from the models listed above may be considered in parallel with the water liquid-vapor phase equilibrium curve to determine the final vapor pressure in the autoclave. FIG. 3(a), overlays the pressure values calculated at various fill percentages onto the equilibrium diagram and accurately depicts the final point of coexistence (deviation point) and the final pressure at set temperature. For completeness, FIG. 3 illustrates both the Redlich-Kwong and Vander-Waals relationships. FIG. 3(b) depicts the experimentally obtained temperature-pressure profiles. The discrepancy between the experimental and calculated may be due to inaccurate calculation of reactor volume, condensation of liquid in the pressure gauge of the reactor, or human error.

The amount of water as a liquid ranges from about 0.1 to about 40 vol %, all subunits and sub-ranges included, of the total volume of the reaction vessel. In non-limiting exemplary embodiments, the water content is about 1%, 2%, 3%, 4%, 5%, 6%, 7%, 8%, 9%, 10%, 12%, 14%, 16%, 18%, 20%, 22%, 24%, 26%, 28%, 30%, 32%, 34%, 36%, 38%, 40% of the total volume of the reaction vessel. One or more additional inert organic solvent may be added to further fine tune the total or partial-gas pressure in the vessel.

In the case of a reaction at 374° C., the water fill percent may be less than 15.6% to achieve an all-gas (steam) reaction medium. All other cases can be numerically computed and experimentally confirmed. The numeric computation involves equating the pressure values obtained by surveying concentration of water in the Vander-Waals or Redlich-Kwong equations with the pressure in the water liquid-vapor equilibrium curve.

After a desirable temperature is reached, the water inside the reaction vessel is substantially in the gaseous state. In some embodiments, more than about 98% or 99% of the water in the vessel is in the gaseous state. In some embodiments, the water in the vessel is in gaseous state and no liquid water exists.

The partial pressure of water in the vessel ranges from about 10 psi to 3000 psi or higher, all subunits and sub-ranges included. Non-limiting ranges include from about 10 psi to 500 psi, from about 500 psi to 700 psi, from about 700 psi to 1000 psi, from about 1000 to 1500 psi, from about 1500 to 2000 psi, from about 2000 psi to 2500 psi, from about 2500 psi to 3000 psi. In other exemplary embodiments, the lower limit of the pressure range is about 150, 200, 250, 300, 350, 400, 450, 500, 550, 600, 650, 700, 750, 800, 850, 900, 950, 1000, 1200, 1400, 1600, 1800, 2000 psi. In some embodiments, the upper limit of the pressure range is about 1000, 1200, 1400, 1600, 1800, 2000, 2200, 2400, 2600, 2800, 3000, 3200, or 3400 psi. In some embodiments, the partial pressure of water in the vessel is about 150, 200, 250, 300, 350, 400, 450, 500, 550, 600, 650, 700, 750, 800, 850, 900, 950, 1000, 1200, 1400, 1600, 1800, 2000, 2200, 2400, 2600, 2800, 3000, 3200, or 3400 psi.

The partial pressure of other gases in the vessel may also be regulated to control the reaction outcome. These gases may be added to the reaction vessel or be formed as part of the reaction within the reaction vessel. For example, the reaction $CaCO_3+SiO_2 CaSiO_3+CO_2$ produces carbon dioxide, and the partial pressure of the $CO_2$ may be regulated to control the thermodynamics of the reaction, i.e., the nonstandard state change in Gibb's free energy. The regulation of the partial pressure of other gases may also be accomplished by the removal of certain gases from the reaction vessel through, e.g., outgassing the reaction vessel. In some embodiments, the partial pressure of any gases added or produced are independently between 0.0000001 and 10,000 atm, all subranges and subunits included. In some embodiments, the partial pressure of carbon dioxide ranges from about 5 to 100 psi, all subranges and subunits included. Non-limiting examples of the partial pressure include about 5, 10, 15, 20, 25, 30, 40, and 50 psi.

A significant advantage of the present invention over traditional method is the much lower temperature range and net-energy required in the crystallization process. Not only is the process cost-efficient, it is also environmentally friendly in terms of generating less side reaction products. The temperature of the reaction ranges from about 101° C. to 1000° C., all subunits and sub-ranges included. In some exemplary embodiments, the lower limit of the temperature range is about 200° C., 250° C., 300° C., 350° C., 400° C., 500° C., 600° C., 700° C., 800° C. or higher, and the upper limit of the range is about 350° C., 400° C., 500° C., 600° C., 700° C., 800° C., 900° C., 1000° C., 1200° C., 1400° C., 1600° C., 1800° C., or 2000° C. More non-limiting examples of temperature include about 150° C., 200° C., 250° C., 300° C., 350° C., 400° C., 450° C., 500° C., 550° C., 600° C., 650° C., 700° C., 750° C., 800° C., 850° C., 900° C., 950° C. and 1000° C.

Silicon dioxide (amorphous or crystalline) is generally used as a reaction precursor. Exemplary sources of silicon include quartz, silica flour, siliceous sand, diatomaceous earth, clays, silica gel, and combination thereof. Meanwhile, the calcium oxide source is selected from calcium carbonate, calcium oxide, calcium hydroxide, and combination thereof.

The ratio between the silicon in the silicon source and the calcium oxide in the calcium oxide source ranges from about 0.5:1 to 3:1, all sub-ratio included. Non-limiting examples include about 0.6:1, 0.8:1, 1:1, 1.2:1, 1.4:1, 1.6:1, 1.8:1:2:1, 2.2:1, 2.4:1, 2.6:1, and 2.8:1. The precursors should be thoroughly mixed to create desirable particle contact and avoid reaction limiting particle separation.

The amount of calcium hydroxide or calcium carbonate in the calcium source may be adjusted to modify the composition of the product and the rate of the reaction. In some embodiments, the calcium oxide source comprises more than about 10%, 20%, 30%, 40%, 50%, 60%, 70%, 80% or 90% of calcium hydroxide or calcium carbonate. In some embodiments, the calcium source comprises mainly calcium hydroxide in order to obtain a pellet configuration. In some embodiments, the calcium source comprises mainly calcium carbonate in order to obtain a powder configuration.

The particle size of the above reaction precursors is preferably less than about 600 mesh to ensure a thorough mixing the precursors and promote a fast crystallization process. In some embodiments, the particle size of one or more of the precursors including the silicon source and the calcium oxide source is less than about 500, 400, 350, 300, 250, 200, 150, or 100 mesh.

An additional material such as an acid, a base or a salt may be added to the above reaction precursors to facilitate the crystallization process. In some embodiments, the reactant mixture consists essentially of a silicon source, a calcium oxide source and a salt. Exemplary salts include potassium chloride, potassium bromide, sodium chloride, and sodium bromide. In some embodiments, the salt is sodium chloride. In some embodiments, basic or acidic additives may be introduced to enhance or modify the reaction. In some embodiments the basic additive is sodium hydroxide. In some embodiments the acidic additive is magnesium chloride. The exact amount of salt depends on the specific salt additive and the product and can be determined by one of ordinary skill in the art without undue experiments.

The composition or mixture of the reactants can be exposed to water steam or dispersed in liquid water. In some embodiments, the exposure is limited to water steam only. In some embodiments, the composition is exposed to the steam after initially being dispersed liquid water.

The silicon source, the calcium oxide source and other additives may be exposed to the desirable pressure and temperature for any period of time depending on the specific composition of the target product. In exemplary embodiments, the reaction condition is maintained for about 10 minutes, 20 minutes, 40 minutes, 1 hour, 2 hours, 3 hours, 4 hours, 6 hours, 8 hours, 10 hours, 12 hours, 14 hours, 16 hours, 18 hours, 20 hours, 30 hours, 35 hours, 40 hours or longer before the product is collected.

Also provided in the present invention is a compound prepared according to the above described methods. This compounds synthesized through methods of the present invention are of crucial importance to anyone that has interest in the field of calcium silicate synthesis, carbon dioxide emissions, and manipulation of hydrothermal reactions for the synthesis of inorganic oxide materials.

EXAMPLES

Example One

Figure 2:
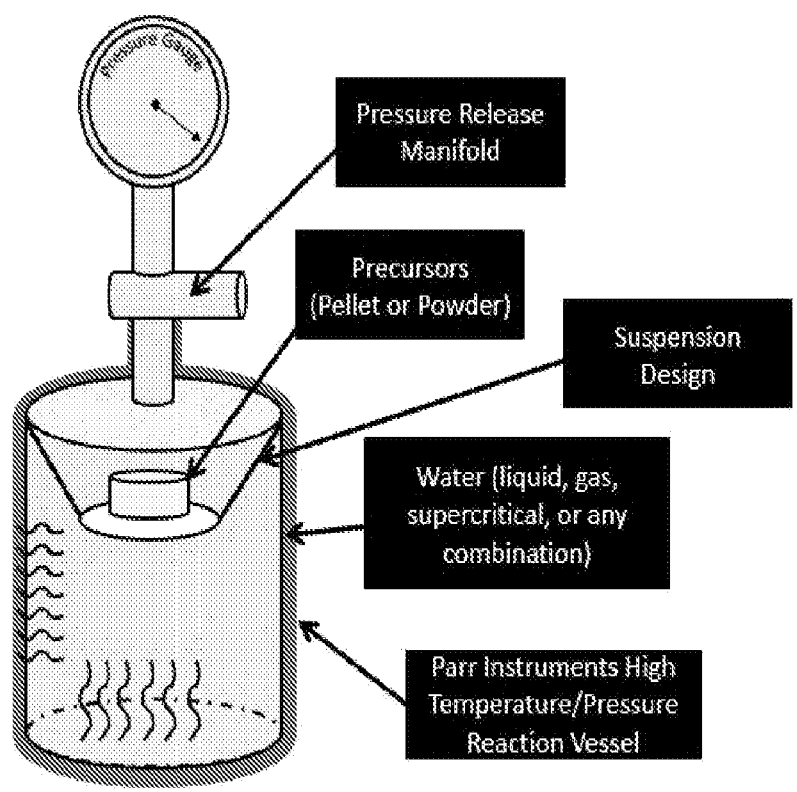
FIG. 2 illustrates the basic experimental configuration utilized for the $CaCO_3+SiO_2$ reaction in a pressurized single-phase gas system.

Equal molar ratios (1:1) of calcium carbonate (3.75 g, Acros 98%, CAS #471-34-1) and silicon dioxide (2.25 g, Quartz, U.S. Silica Co., Berkley Springs, W. Va., CAS #14808-60-7) were dry mixed in a Spex mill (8000M Mixer/Mill Spex Certiprep, zirconia vial and media, Metuchen, N.J.) for 10 min and then pressed into a 1" cylindrical pellet (96.8 MPa). The pellet was then suspended over a bath of de-ionized (18.2 MΩ) liquid water in a Hastalloy C-276 alloy hydrothermal reaction vessel (HAST C 1807H04, Parr Instruments, Moline, Ill.) as shown in FIG. 2.

Since the amount of water dictated the resulting pressure, the volume fill-percent was varied from 0 to 20%. The Vander-Waals equation was used to numerically compute the resulting pressure:

$$\left(P + \frac{n^2 a}{V^2}\right)(V - nb) = nRT$$

where P is the pressure (atm), V is the volume (liters), n is the quantity of water (moles), R is the molar gas constant (8.314 J/mol·K), and a and b are the proportionality constants (a=5.46 atm·L$^2$/mol$^2$ and b=0.0305 L/mol for $H_2O$). Increasing the volume fill percentage past 16.97% at temperatures >374° C. created a supercritical environment ($P_{H_2O}$>3200 psi). Reducing the fill % below 16.97% created a steam environment. All of the pressures calculated using the Vander-Waals equation may be considered in parallel with the water liquid-vapor phase equilibrium curve to determine the final vapor pressure in the autoclave. FIG. 3a overlays the pressure values calculated at various fill %'s onto the equilibrium diagram and accurately shows the final point of coexistence (deviation point) and the final pressure at set temperature. Phase evolution in several different high pressure steam atmospheres were evaluated. This numerical computation mostly matched the experimental pressures (FIG. 3b) with some discrepancy due to condensation in the reactor extremities.

The vessel was then sealed according to manufacturer specifications (30 ft-lb of torque per bolt). Afterwards, it was placed into a heater (Cart Heater, 5000 psi, 500° C., HT/HP 21571, Parr Instruments, Moline, Ill.), heated to 430° C., and held isothermally for roughly 12 h. Upon reaction completion, the vessel was de-pressurized at 430° C. using a gas-outlet valve, and then cooled to room-temperature. The pellet was then retrieved from the reactor and fully characterized. Typically, if any reaction between $CaCO_3$ and $SiO_2$ occurred, a mass loss from the evolution of $CO_2$ would be evident and reaction quantification was done by decomposing the remaining $CaCO_3$ in the TGA/DSC/MS system. XRD was utilized for phase formation analysis and SEM was used for morphology observation.

Three reaction systems were focused on: (1) reactions along the vapor-pressure curve of water, and high-pressure steam reactions at (2) 350° C. and (3) 430° C. Two additional reactions consisting of only quartz or calcite were also performed to better understand the reaction mechanism in the $CaSiO_3$ system. $CaSiO_3$ formation was completed at 430° C. and 850 psi $P_{H_2O}$.

The reaction products were characterized with x-ray diffraction (XRD), scanning electron microscopy (SEM), surface area analysis (BET), and thermogravimetric analysis coupled with both differential scanning calorimetry and mass spectrometry (TGA/DSC/MS). The Bruker D8 Discover x-ray diffractometer (Cu-Kα, λ=1.514 Å, Parallel beam, Vantec 1 Detector, Germany) was used to qualitatively (NIST ICSD, FIZ Karlsruhe, Germany) and semi-quantitatively (Jade 9.1, Rietveld refinement) determine the phase crystallinity in the 10-80° range, with a step size of 0.018°, and a dwell time of 0.5-s. A Zeiss Sigma Field Emission SEM was used (5 kV, Mag=100 KX, WD=7.3 mm, Carl Zeiss Microscopy GmbH, Jena, Germany) to observe the morphology and particle size. A Micromeritics Tristar BET (Norcross, Ga.) was used to measure the surface area (not reported). The Netzsch STA449-F3 TGA/DSC coupled with Aeolos 403D MS (Netzsch, Germany) was used to quantitatively confirm reaction completion by measuring the mass of the powder after decomposing the remaining $CaCO_3$. The reaction products were heated from 25 to 1500° C. with a ramp rate of 10° C./min in a flowing $N_2$ (100 ml/min) atmosphere.

The simulated solid precipitation curves from the $CaCO_3$:$SiO_2$:$H_2O$ system illustrated in FIG. 4a. show the boundary conditions for $CaSiO_3$ synthesis. With increasing temperature and pressure (autogenous), the concentration of $CaCO_3$ and $SiO_2$ decreases as the concentration of $CaSiO_3$ increases; $CaCO_3(s)+SiO_2(s) \rightleftharpoons CaSiO_3(s)+CO_2(g)$. The software limit of 350° C. was chosen as the temperature limit for the simulations. A simulated chemical diagram (FIG. 4b) of this reaction system shows that the $CaSiO_3$ phase in the $CaCO_3$:$SiO_2$:$H_2O$ system is thermodynamically stable above 206° C. However, since these simulations only provide information on the thermodynamic stability of phase formation, kinetic feasibility can only be determined through experimentation. The starting experimental hydrothermal reaction parameters of 350° C. and autogenous pressure were chosen based on these simulations and an extensive literature survey.

Figure 5:
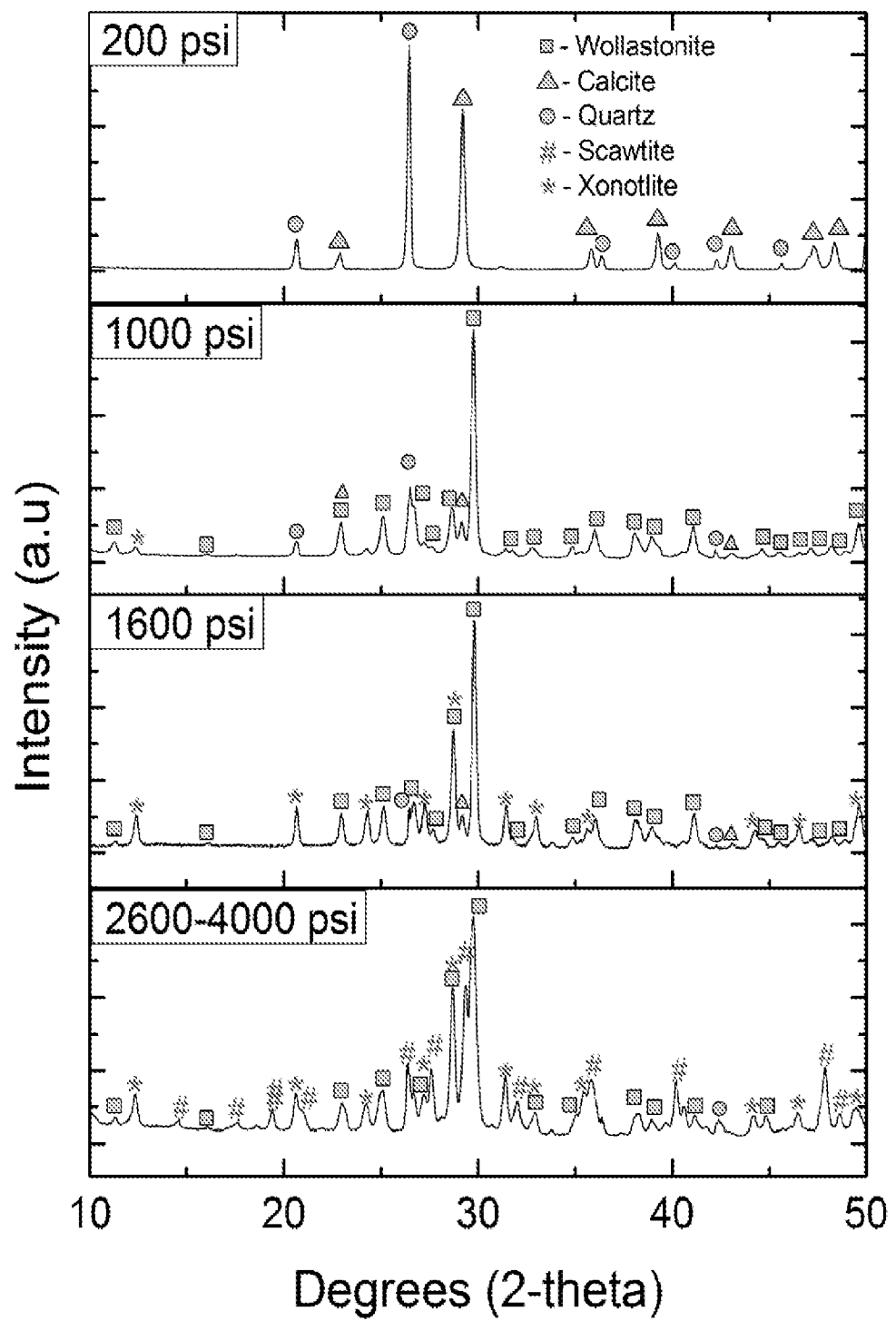
FIG. 5 illustrates the X-ray diffraction analysis of the phase evolution in the $CaCO_3:SiO_2:H_2O$ system at various partial pressure of water.
Figure 6:
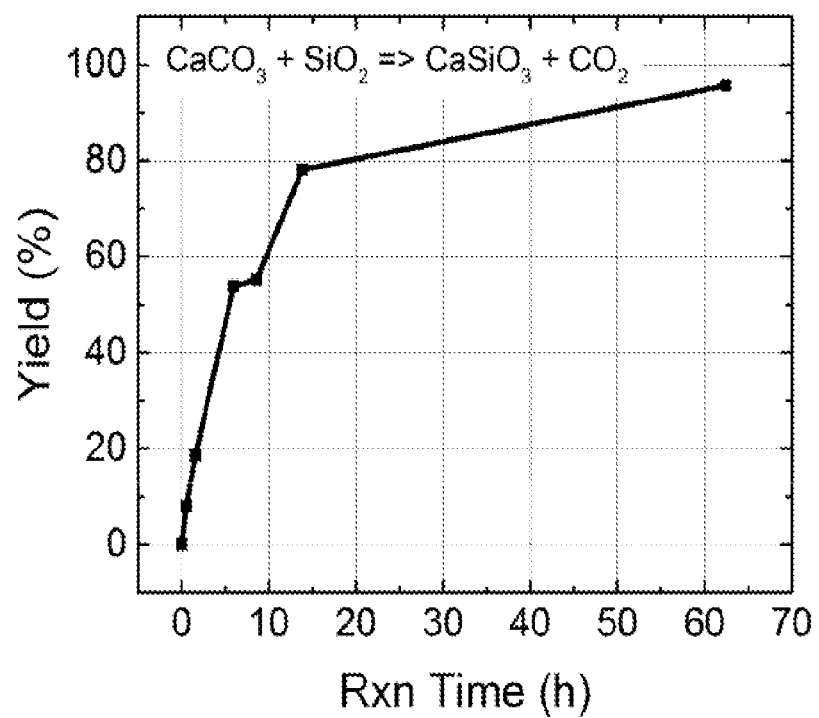
FIG. 6 illustrates the kinetics evaluation of the $CaSiO_3$ synthesis for at 430° C. and 850 psi for the following reactions times: 0.5, 1.5, 6, 8.5, 14, and 63 h.

X-ray diffraction was used to confirm phase purity. Each reaction yielded slightly different results, with pressure playing a direct role in the composition of the product. Experiments with just $CaCO_3$ retained full weight and crystallinity and were concluded to not react with water. The reactions at 430° C. yielded scawtite ($Ca_7Si_6(CO_3)O_{18}\cdot 2H_2O$), xonotlite ($Ca_6Si_6O_{17}(OH)_2$), wollastonite (Ca-$SiO_3$) and "no reaction" at 2600-4000, 1600, 1000, and 200 psi respectively as the primary phases. The 350° C. reaction resulted in scawtite, and xonotlite at 1400 and 800 psi respectively as the primary phases (not reported). All reactions had some xonotlite and wollastonite present. FIG. 5 shows the XRD patterns for each pressure system at 430° C. The kinetics study (430° C. and $P_{H_2O}$=850 psi) revealed that a reaction yield >50% requires >6 hours of reaction time and >60 h to have >90% reaction (FIG. 6).

Figure 7:
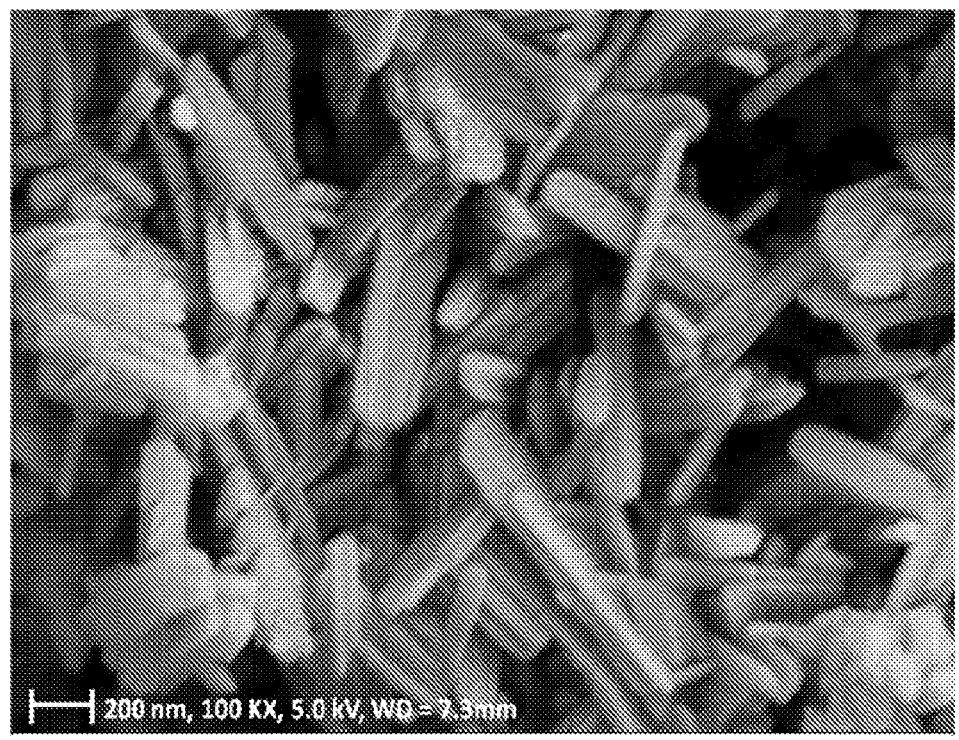
FIG. 7 illustrates the scanning electron microscopy of phase-pure $CaSiO_3$ (wollastonite) synthesized at 430° C. and 1000 psi.

Scanning electron microscopy was used to image the morphology of the synthesized $CaSiO_3$. FIG. 7 shows the synthesized rod (acicular) morphology of the $CaSiO_3$ crystallites. A random sampling revealed that the rods are approximately 500 nm long and 50 nm wide.

Figure 8:
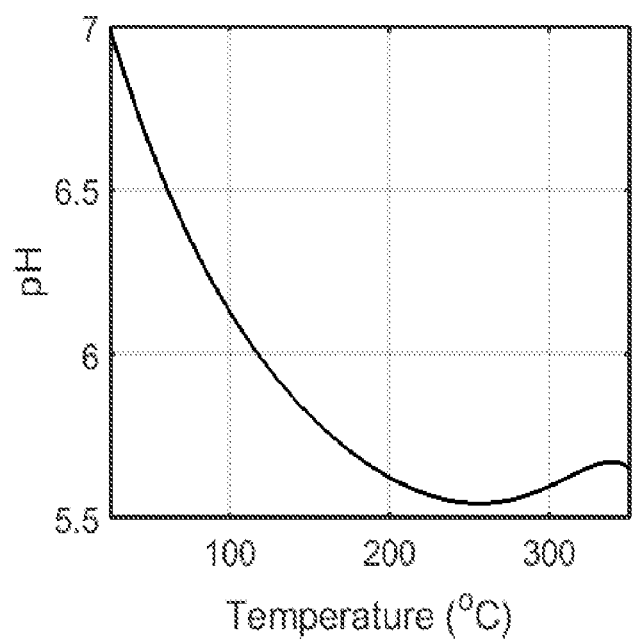
FIG. 8 illustrates the changes in the pH of the water medium as the temperature and pressure (autogenous) increase.
Figure 9:
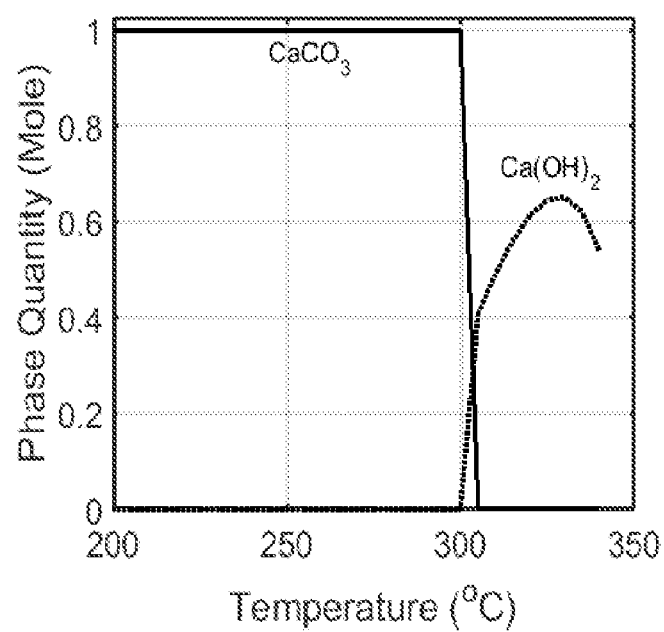
FIG. 9 illustrates the solubility of $CaCO_3$ in a hydrothermal environment at set temperatures and autogenous pressures.
Figure 10:
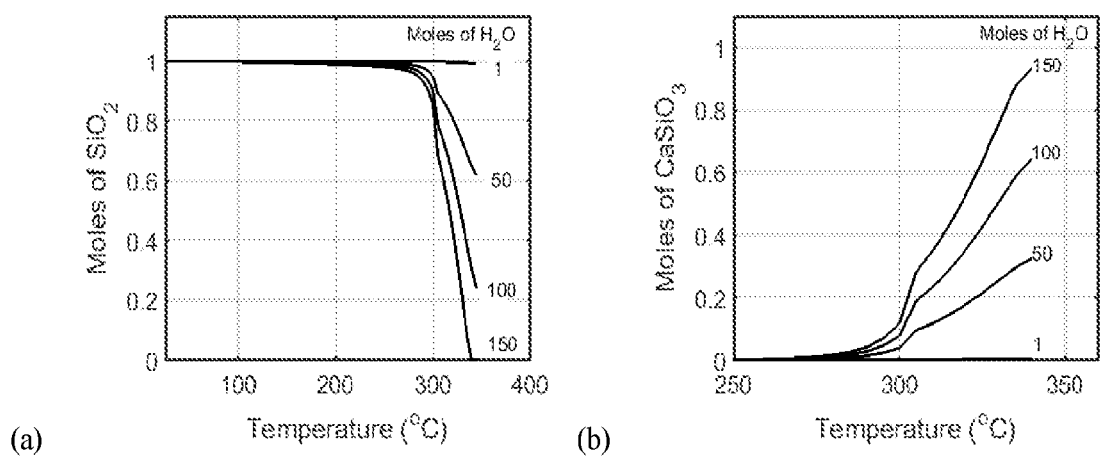
FIG. 10 illustrates (a) solubility of $SiO_2$ and (b) crystallization of $CaSiO_3$ in a hydrothermal environment at set temperatures and autogenous pressures.

Traditionally, hydrothermal reactions rely on the solubility of precursors in water for reactions to occur. The relationship between solubility, temperature, and pressure directly supports the need for higher temperatures in closed systems to facilitate some reactions. The acidity or basicity (pH) of water is also interrelated in this reactivity measurement, as it assists in the dissolution of precursors. The electrolyte solution simulation software (OLI analyzer 9.2) can determine the solubility of the precursors of interest and therefore provide some insight into the reaction mechanism between $CaCO_3$ and $SiO_2$. FIG. 8 shows the changes in the pH of the water medium as the temperature and pressure (autogenous) increase. As the supercritical point of water ($P_{H_2O}$=3200 psi, T=374° C.) is approached, the pH shifts from neutral (pH=7) to slightly acidic (pH=5). This acidic environment would favor the dissolution of our $CaCO_3$ precursor (FIG. 9) and therefore increase the favorability of reaction. On the other hand, the solubility of $SiO_2$ is primarily dependent on the quantity of water at 350° C. FIG. 10a shows that increasing the solvent ($H_2O$) quantity to 150 liters allows for full dissolution of 1 mole of $SiO_2$ and immediate conversion (FIG. 10b) to 1 mole of $CaSiO_3$. The software, however, has its limitations, it is not very accurate above 300° C., does not have several phases in the database (i.e. xonotlite), and can only operate in solutions that never deviate from the vapor-pressure curve. Therefore, we cannot fully model our reaction conditions and can only hypothesize on the actual thermodynamics at our reaction conditions.

Figure 14:
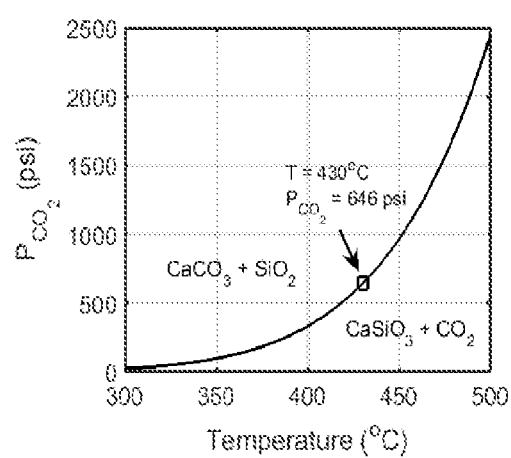
FIG. 14 illustrates equilibrium phase diagram of the $CaCO_3+SiO_2 \rightleftharpoons CaSiO_3+CO_2$ reaction in a broad range of temperatures and $CO_2$ partial pressures.
Figure 15:
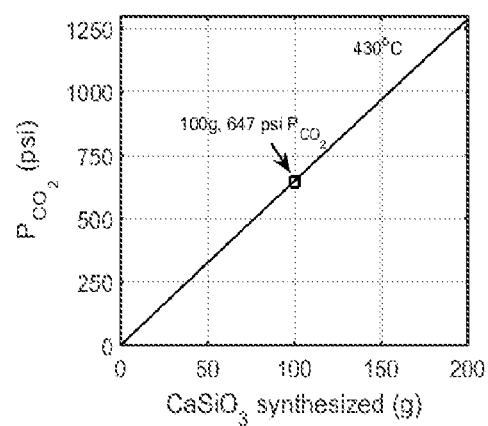
FIG. 15 illustrates non-thermodynamic equilibrium computation of the $CO_2$ partial pressure produced from a $CaCO_3+SiO_2 \rightleftharpoons CaSiO_3+CO_2$ reaction in a 1-L batch reactor.
Figure 16:
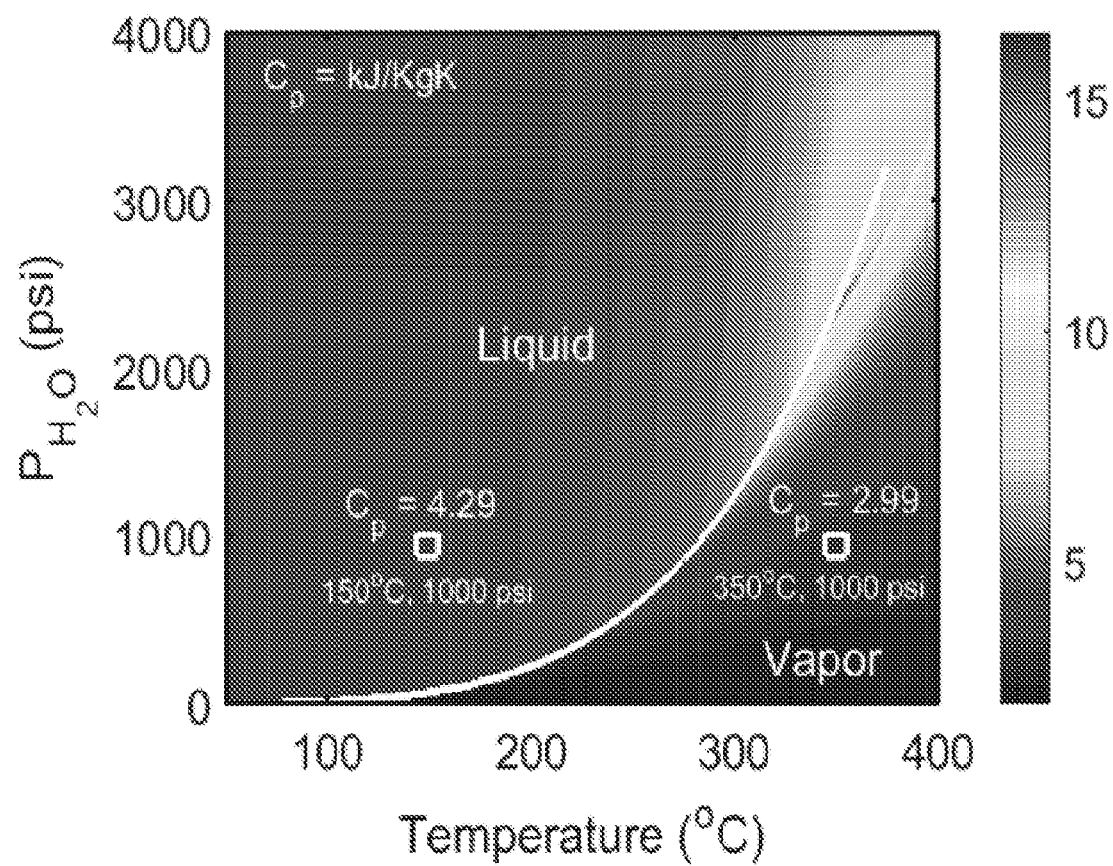
FIG. 16 illustrates heat capacity of $H_2O$ in the hydrothermal environment. The white line represents the water liquid-vapor equilibrium curve (Liquid above and vapor below the line).

Thermodynamically, the $CaCO_3(s)+SiO_2(s) \rightleftharpoons CaSiO_3(s)+CO_2(g)$ reaction is possible at temperatures above 563K (290° C., FIG. 11). Raising the temperature above 889° C. would reduce the $\Delta G_{rxn}$ and make this reaction more favorable than the $CaO+SiO_2$ reaction, but this would require a very high $pCO_2$ to avoid premature decomposition of $CaCO_3$. The $6CaCO_3(s)+6SiO_2(s) \rightleftharpoons Ca_6Si_6O_{17}(OH)_2(s)+6CO_2(g)$ (Xonotlite formation) reaction becomes favorable at 454° C. at 1 atm total pressure. Raising the $P_{H2O}$ of this system would lower the xonotlite formation temperature and create a favorable formation environment in the 350 to 400° C. region (FIG. 12). FIG. 12b illustrates the solid-gas equilibrium phase diagram of the $6CaCO_3+6SiO_2+H_2O \rightleftharpoons Ca_6Si_6O_{17}(OH)_2+6CO_2$ reaction for temperatures of (a) 150, (b) 200, (c) 240, (d), 300, and (e) 350° C. The region above each line represents the $6CaCO_3+6SiO_2+H_2O$ stability field, while the region below each line represents the $Ca_6Si_6O_{17}(OH)_2+6CO_2$ stability field. The solid-lines represent an unsaturated vapor reaction environment, while the circles illustrate the saturation point. The dotted line (f) represents the atmospheric $CO_2$ concentration: 400 ppm. Since the partial pressures of water for the reactions described in the experimental section are significantly above ⅙ atm, some xonotlite formation is expected. The amount of xonotlite formation is governed by thermodynamics, as xonotlite would begin to self-carbonate at very low $CO_2$ partial pressures (<3 grams at $P_{CO2}$=19.3 psi, FIG. 13) in a 1-L batch reactor at 430° C. and $P_{H2O}$=1000 psi. The self-carbonation of wollastonite occurs at higher partial pressures of $CO_2$ than xonotlite (FIG. 14), and as a result more $CaSiO_3$ can be synthesized in a 1-L batch reactor at 430° C. (~100 grams at $P_{CO2}$=647 psi, FIG. 15). In conclusion, the synthesis of $CaSiO_3$ as the primary phase at 430° C. and $P_{H2O}$ of 1000 psi can be explained with thermodynamic predictions.

Another explanation for this method of calcium silicate formation may lie in the surface interaction between the high pressure superheated steam and the precursors. Literature provides some insights into the possible reaction mechanisms that may be dominating in this system. The introduction of water-vapor in solid-state reactions has been shown to reduce the crystallization temperature of several oxide materials, including $CaSiO_3$, $Ca_2SiO_4$, and $BaTiO_3$. The reduction of the $CO_2$ partial pressure for weakening the $Ca$—$CO_3$ bonds, gas phase calcium ion diffusion, and diffusion by vacancy formation have been offered as viable explanations for the reduced crystallization temperature. It is possible that the gaseous water is facilitating the diffusion of $Ca^{2+}$ ions from $CaCO_3$ into the steam treated $SiO_2$ surface.

Example Two

Figure 18:
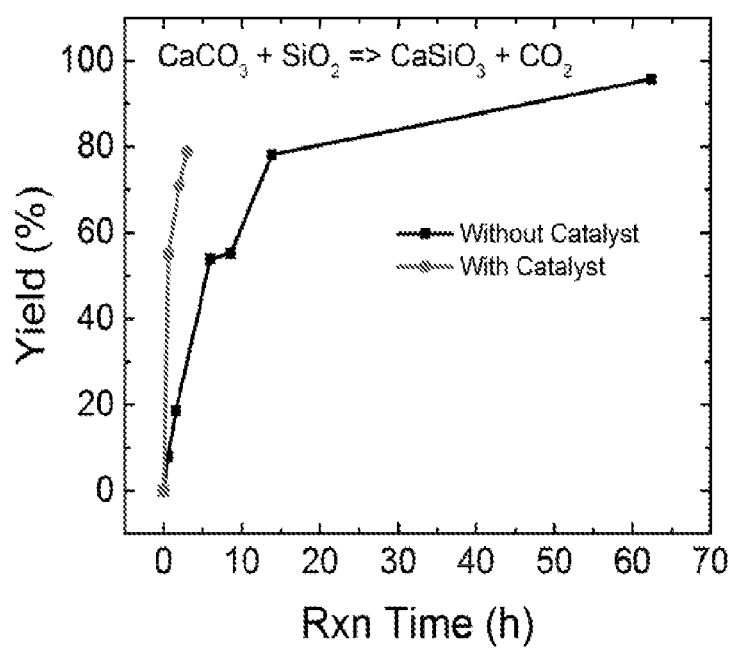
FIG. 18 illustrates kinetics evaluation of the CaSiO3 synthesis for the (a) NaCl-assisted CaCO3+SiO2 reaction and (b) standard.

The kinetics of $CaSiO_3$ synthesis were analyzed empirically. The 1:1 $CaCO_3$: $SiO_2$ mixture was placed into the specified hydrothermal reaction conditions (described elsewhere, main manuscript) for designated time slots, and then characterized by x-ray diffraction (XRD) and thermogravimetry (TGA). Reaction time was defined as the time henceforth stable pressure and temperature were achieved (FIG. 18). Using this definition, the following reaction times were chosen: 0.5, 1.5, 6, 8.5, 14, and 63 h. XRD was utilized to confirm crystallinity, while TGA was used to quantify reaction yield. Since, no CaO phase appeared in the XRD pattern, the decomposition of the remaining $CaCO_3$ in the product was satisfactory for accurate quantification. If the reaction proceeded to 100%, then the mass loss in the 650-800° C. region would be 0 wt %. Otherwise, the reaction yield was determined by the mass loss in this region divided by the theoretical $CO_2$ quantity in an un-reacted sample (27.5 wt %).

Yield %=$(1-(m_{loss}/m_{th}))*100$

The black line in FIG. 18 depicts the kinetics study. Yields greater than 80% can be seen as the reaction time exceeds 14 h.

Example Three

Further research regarding the $CaCO_3+SiO_2 \rightleftharpoons CaSiO_3+CO_2$ reaction included optimizing kinetics. Using a similar approach as Zhang et al (*J. Am. Ceram. Soc.* 5, 2015), we incorporated sodium chloride (NaCl) into the raw material mixture to enhance diffusion. The exact procedure for the addition of NaCl was the following:
(1) A 30 wt % NaCl solution was created by mixing reagent grade NaCl with de-ionized water.
   a. Solution was considered ready for experimentation once all of the NaCl dissolved
(2) Five grams of the 1:1 $CaCO_3$:$SiO_2$ mixture was mixed with 5 grams of the NaCl solution
(3) This mixture was dried overnight at 90° C.
(4) A 1" pellet was pressed with 96 MPa of pressure.
(5) This pellet was then reacted at 430° C. and 30 ml (~850 psi) for designated amount of time.

The results from this study are also depicted alongside the regular kinetics study in FIG. 19. The addition of NaCl increased the kinetics 12-fold (comparing 6 and 0.5 h reactions for the standard and NaCl-assisted $CaCO_3+SiO_2$ reaction, respectively). After a 2 h reaction, yields above 70 wt % were observed.

Figure 17:
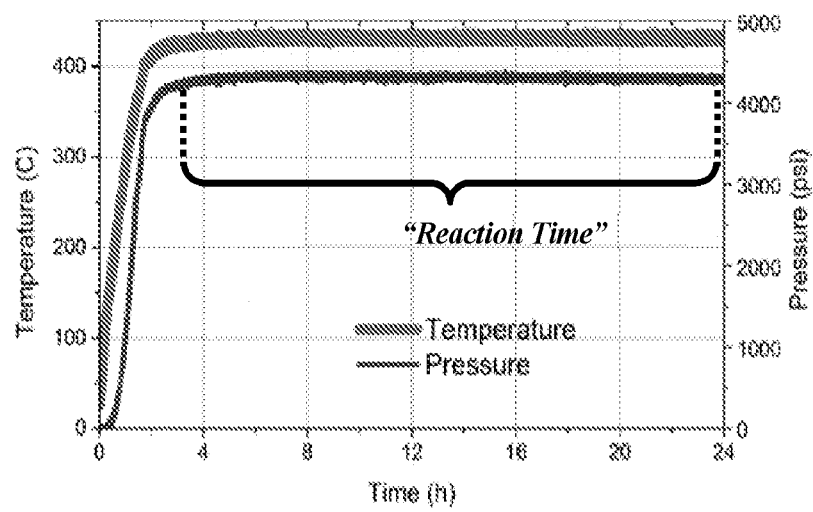
FIG. 17 illustrates reaction time definition: the time henceforth stable pressure and temperature were achieved.

The method of material synthesis of the present invention has the potential to stimulate research in other fields by introducing another synthesis variable (vapor pressure). Reducing the pressure can yield new phases, change kinetics, and allow for a low-cost reactor options for lab and pilot plant scale-up. The "all-steam" reaction medium also eliminates the need for complicated liquid solution solubility calculations to determine stability versus reactivity. The reaction could be simplified into standard solid-state thermodynamic free energy calculations. The low-cost reactor option is possible since high-pressures may no longer be necessary for the facilitation of hydrothermal reactions. A reaction at 400° C. will no longer require expensive corrosion-resistant Ni-rich alloy vessels to house pressures >4000 psi, but instead may utilize stainless or even mild steel. There is also an energy savings aspect that needs to be explored. After the deviation from the equilibrium curve, we are no longer heating liquid water to create a steam atmosphere (heat capacity, Cp=10.1 kJ/kgK @ 350° C.), but instead are directly heating an all gas (steam, Cp=2.9 kJ/kgK @ 350° C.) atmosphere. The change in heat capacity has been plotted in FIG. 17, which shows a large difference between the heat capacity of liquid, gas, and supercritical water. In contrast other hydrothermal methods follow the liquid-vapor equilibrium curve and pay an energy penalty for large heat-capacities of liquid water. This factor negates any energy savings that could be expected from an otherwise low temperature process. The reaction system of the present invention achieves an all gas medium after ~250° C. and this allows for operation in a region of low heat capacity.

Examples Four to Twenty

Additional products were synthesized to demonstrate the versatility of the HVS synthesis method according to experimental configurations as described above. Table 1 provides a list of these products, the precursors from which the product was formed, and the temperature and pressure at which the reaction occurred.

TABLE 1

| Product | Precursor #1 | Precursor #2 | Temp (° C.) | Pressure (psig) |
|---|---|---|---|---|
| $MgAl_2O_4$ | $Mg(OH)_2$ | $Al_2O_3$ | 350-500 | 1000 |
| $Mg_6Al_2CO_3(OH)_{16}*4H_2O$ | $Mg(OH)_2$ | $CO_2, Al_2O_3$ | <350 | 1000 |
| $CaSiO_3$ | $CaCO_3$ | $SiO_2$ | 350 | 850 |
| $Ca_6Si_6O_{17}(OH)_2$ | $CaCO_3$ | $SiO_2$ | 350 | 1500 |
| $Ca_7Si_6CO_3O_{18}\cdot 2(H_2O)$ | $CaCO_3$ | $SiO_2$ | 350 | 2000-4000 |
| $2Y_3Al_5O_{12}$ | $Y(OH)_3$ | $Al_2O_3$ | 430 | 1000 |
| $SrZrO_3$ | $Sr(OH)_2$ | $ZrO_2$ | 430 | 1000 |
| $ZnAl_2O_4$ | $ZnO$ | $Al_2O_3$ | 430 | 1000 |
| $CaTiO_3$ | $CaCO_3$ | $TiO_2$ | 430 | 1000 |
| $Ba_2Ti_9O_{20}$ | $BaCO_3$ | $TiO_2$ | 430 | 1000 |
| $LiMn_2O_4$ | $Li_2CO_3$ | $Mn_2O_3$ | 430 | 1000 |
| $Li_2MnO_3$ | $Li_2CO_3$ | $Mn_2O_3$ | 430 | 1000 |
| $Co_3O_4$ | $Li_2CO_3$ | $CoO$ | 300 | 850 |
| $LiCoO_2$ | $Li(OH)*H_2O$ | $CoO$ | 350 | 1020 |
| $Y_2Ti_2O_7$ | $Y_2O_3$ | $TiO_2$ | 350 | 1020 |
| $Li_2Mn_2O_3$ | $Li(OH)*H_2O$ | $MnCO_3$ | 350 | 1020 |
| $LiV_3O_8$ | $Li(OH)*H_2O$ | $V_2O_5$ | 350 | 1020 |

Figure 21:
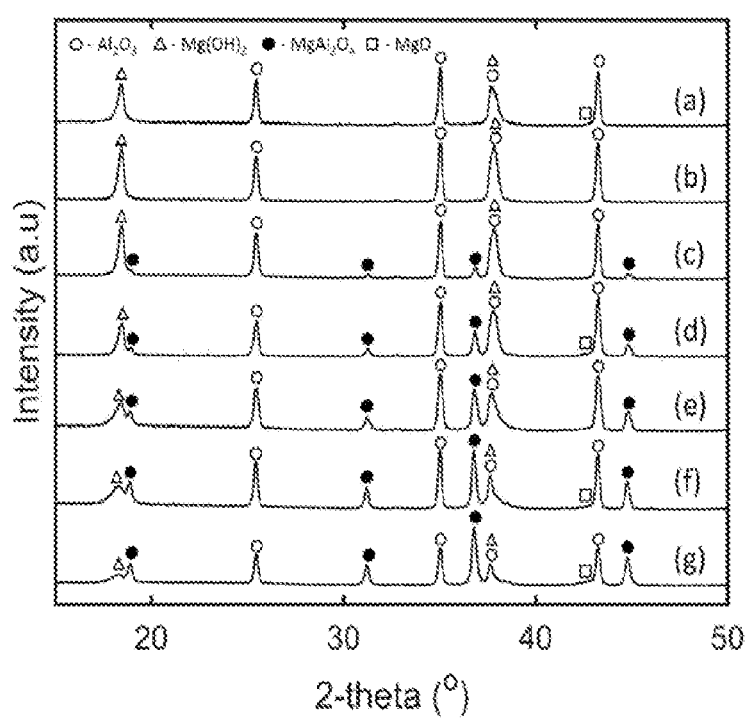
FIG. 21 illustrates the X-ray diffraction analysis showing the formation of $MgAl_2O_4$ at various temperatures.

X-ray diffraction patterns showing the formation of the $MgAl_2O_4$ phase from $Mg(OH)_2$ and $Al_2O_3$ precursors after hydrothermal vapor treatment at (a) raw material mixture (unreacted) (b) 370, (c) 390, (d) 410, (e) 430, (f) 450, and (g) 470° C. at 58 atm for 7 h is shown in FIG. 21.

Figure 22:
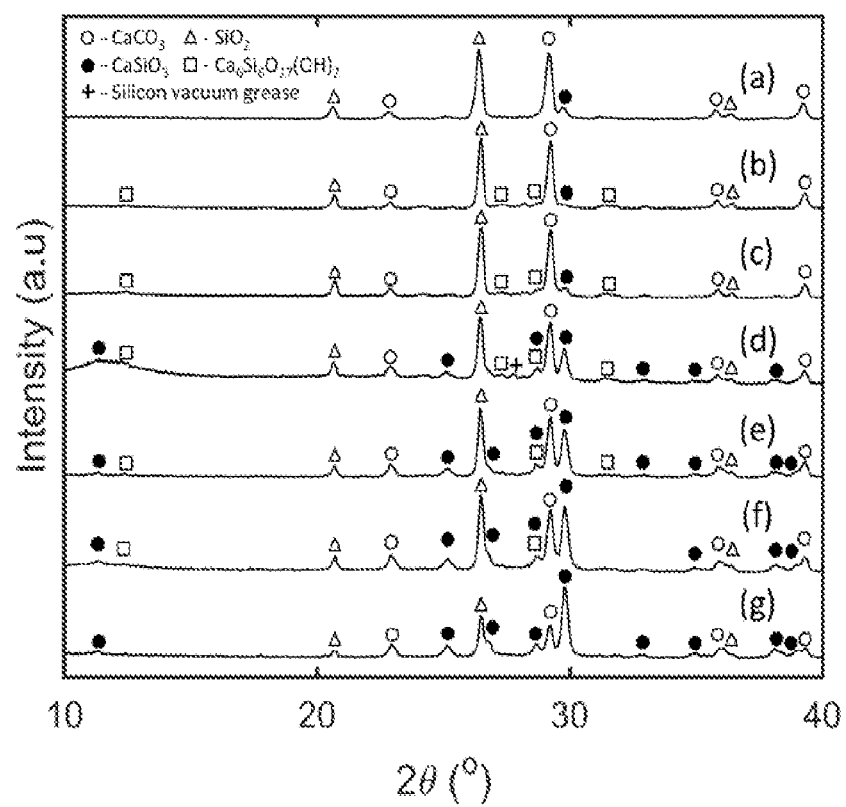
FIG. 22 illustrates the X-ray diffraction analysis showing the formation of $\beta$-$CaSiO_3$ and $Ca_6Si_6O_{17}(OH)_2$ at various temperatures.
Figure 23:
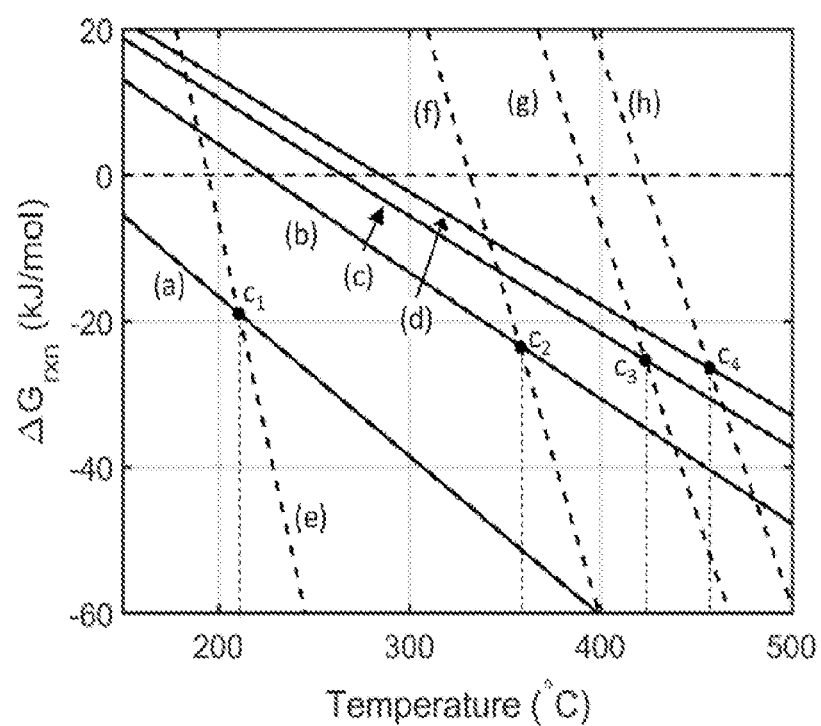
FIG. 23 illustrates the non-standard state Gibb's free energy of reaction for the solid-gas systems $CaCO_3+SiO_2 \rightleftharpoons CaSiO_3+CO_2$ and $6CaCO_3+6SiO_2+H_2O \rightleftharpoons Ca_6Si_6O_{17}(OH)_2+6CO_2$ at various partial pressures of $CO_2$.

X-ray diffraction patterns showing the formation of the β-$CaSiO_3$ and $Ca_6Si_6O_{17}(OH)_2$ phases from $CaCO_3$ and $SiO_2$ precursors after 7 h hydrothermal vapor treatment at (a) 310, (b) 330, (c) 350, (d) 370, (e) 390, (f) 410, and (g) 430° C. is shown in FIG. 22. FIG. 23 illustrates the non-standard state Gibb's free energy of reaction for the following solid-gas systems: (solid, a, b, c, d) —$CaCO_3+SiO_2 \rightleftharpoons CaSiO_3+CO_2$ and (dash, e, f, g, h)—$6CaCO_3+6SiO_2+H_2O \rightleftharpoons Ca_6Si_6O_{17}(OH)_2+6CO_2$. Reactions (a) and (e) are determined for $P_{CO2}=0.0005$ atm. Reactions (b) and (f) are determined for $P_{CO2}=0.1$ atm. Reactions (c) and (g) are determined for $P_{CO2}=0.5$ atm. Reactions (d) and (h) are determined for $P_{CO2}=1$ atm. Where relevant (i.e., $Ca_6Si_6O_{17}(OH)_2$ reactions), the $PH_2O$ was designated as 58 atm.

Figure 24:
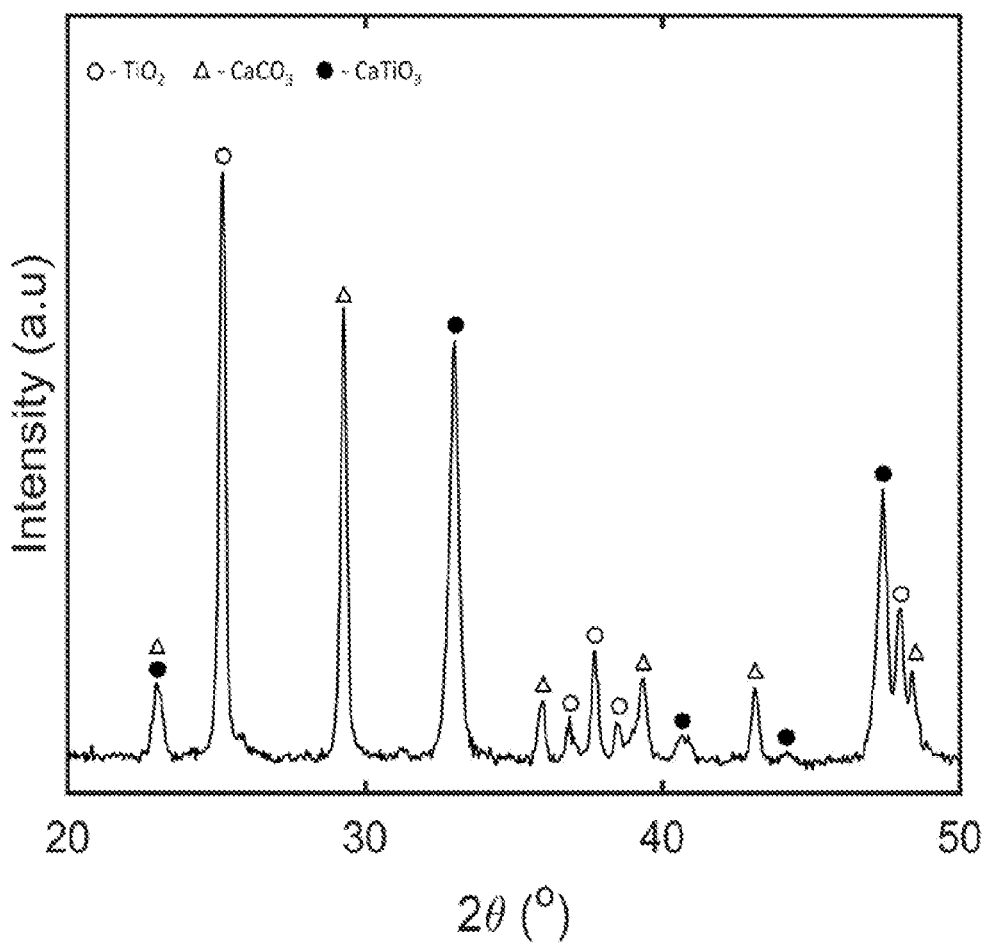
FIG. 24 illustrates the X-ray diffraction analysis showing the formation of $CaTiO_3$.
Figure 25:
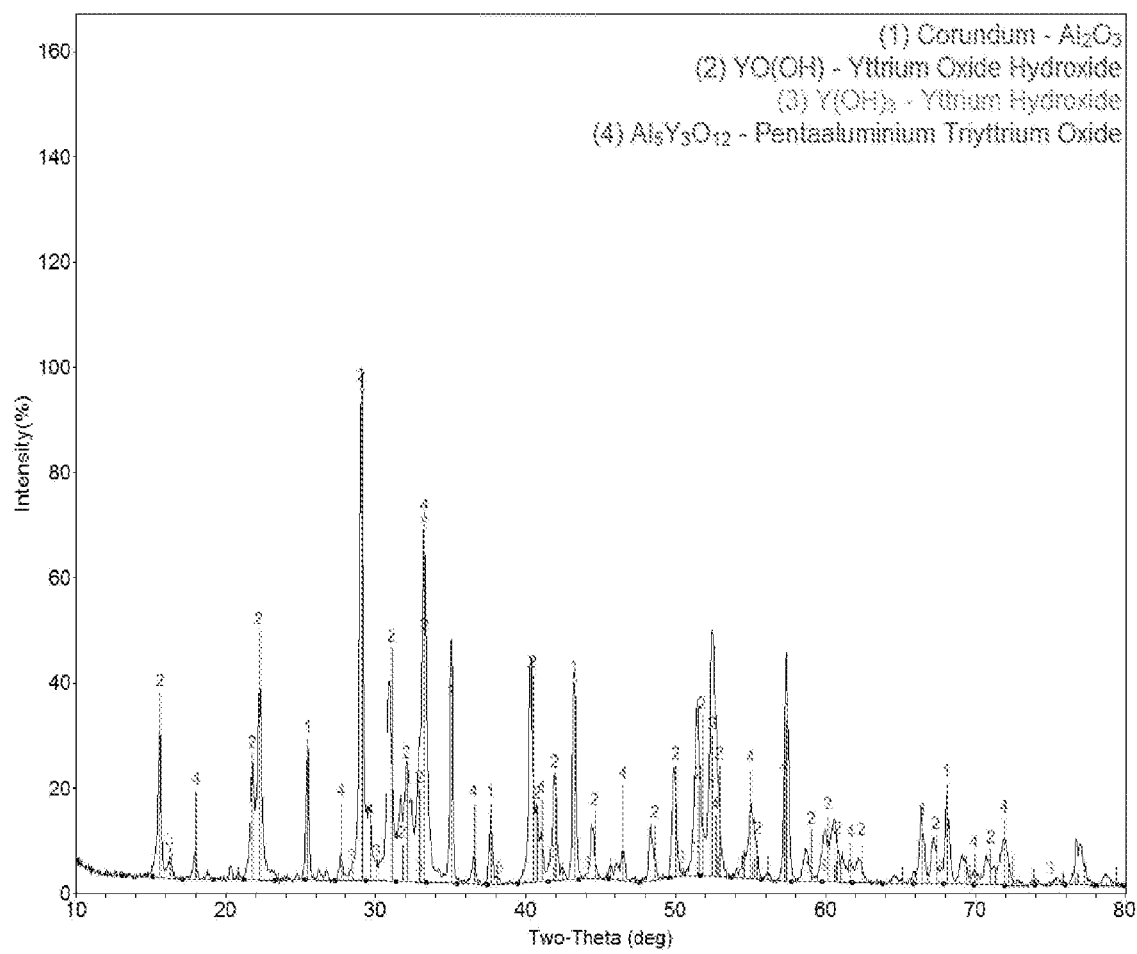
FIG. 25 illustrates the X-ray diffraction analysis showing the formation of $Y_3Al_5O_{12}$.
Figure 26:
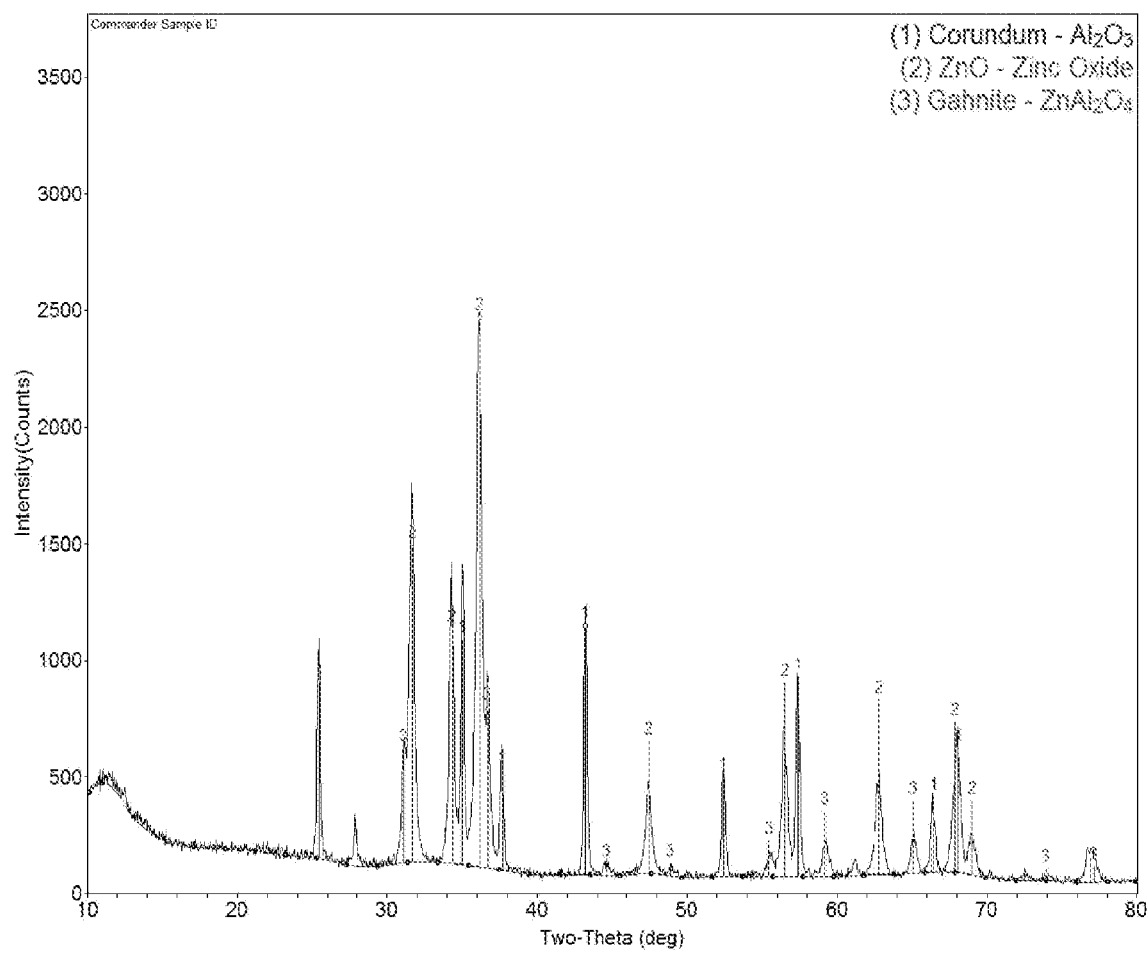
FIG. 26 illustrates the X-ray diffraction analysis showing the formation of $ZnAl_2O_4$.
Figure 27:
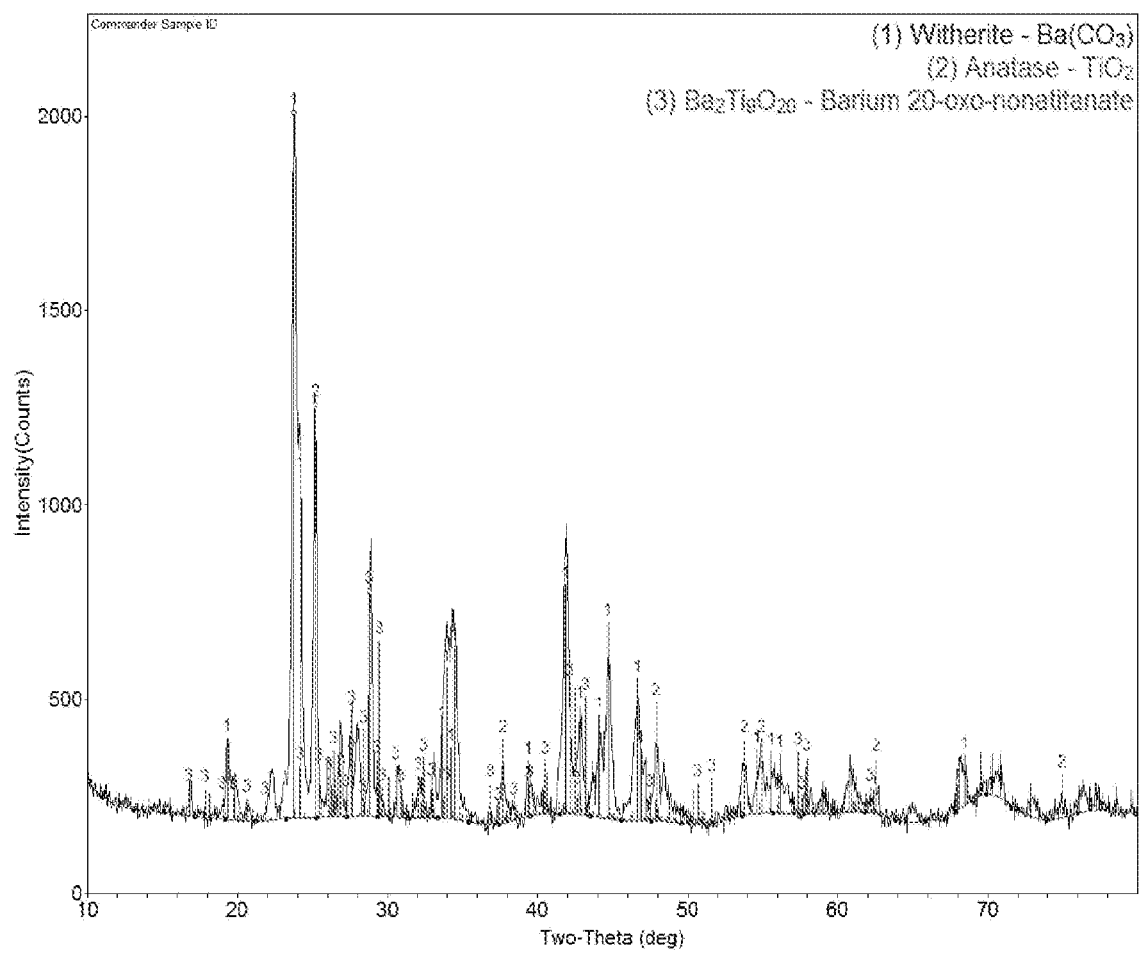
FIG. 27 illustrates the X-ray diffraction analysis showing the formation of $Ba_2Ti_9O_{20}$.
Figure 28:
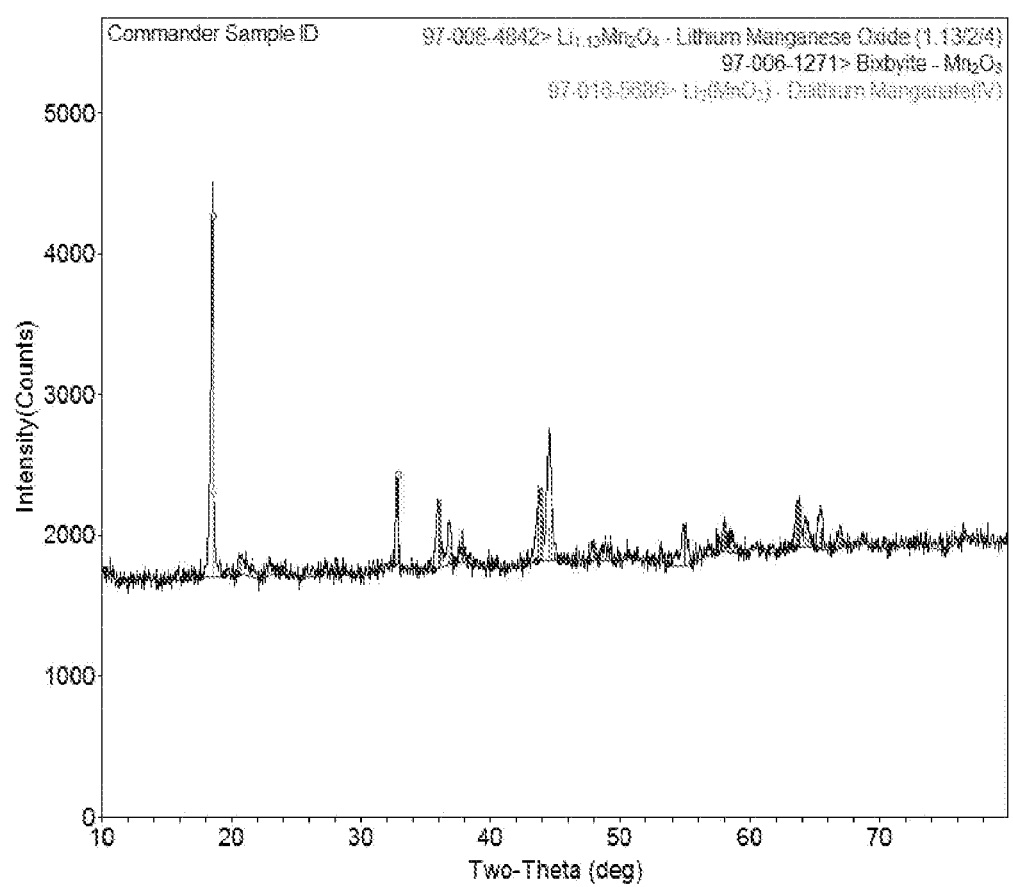
FIG. 28 illustrates the X-ray diffraction analysis showing the formation of $Li_2MnO_3$ and $LiMn_2O_4$ from $Li_2CO_3$ and $Mn_2O_3$.
Figure 29:
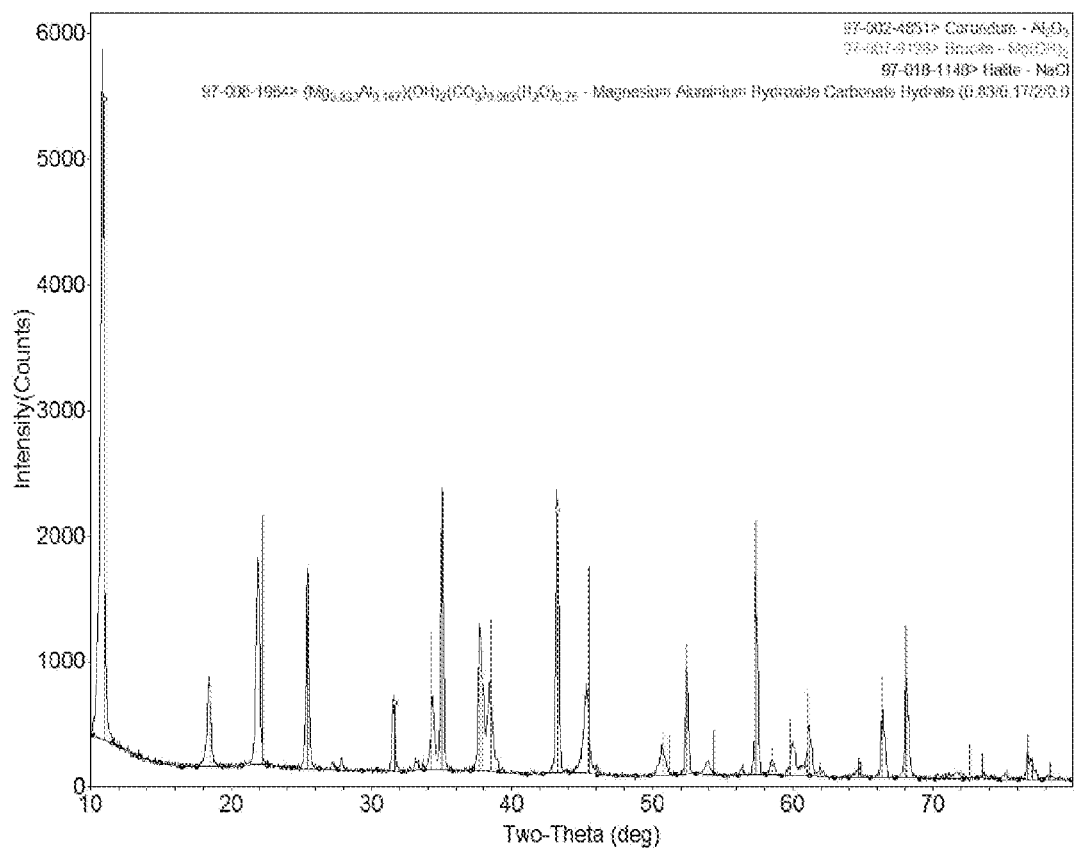
FIG. 29 illustrates the X-ray diffraction analysis showing the formation of $Mg_{0.833}Al_{0.167}(OH)_2(CO_3)_{0.083}(H_2O)_{0.75}$.
Figure 30:
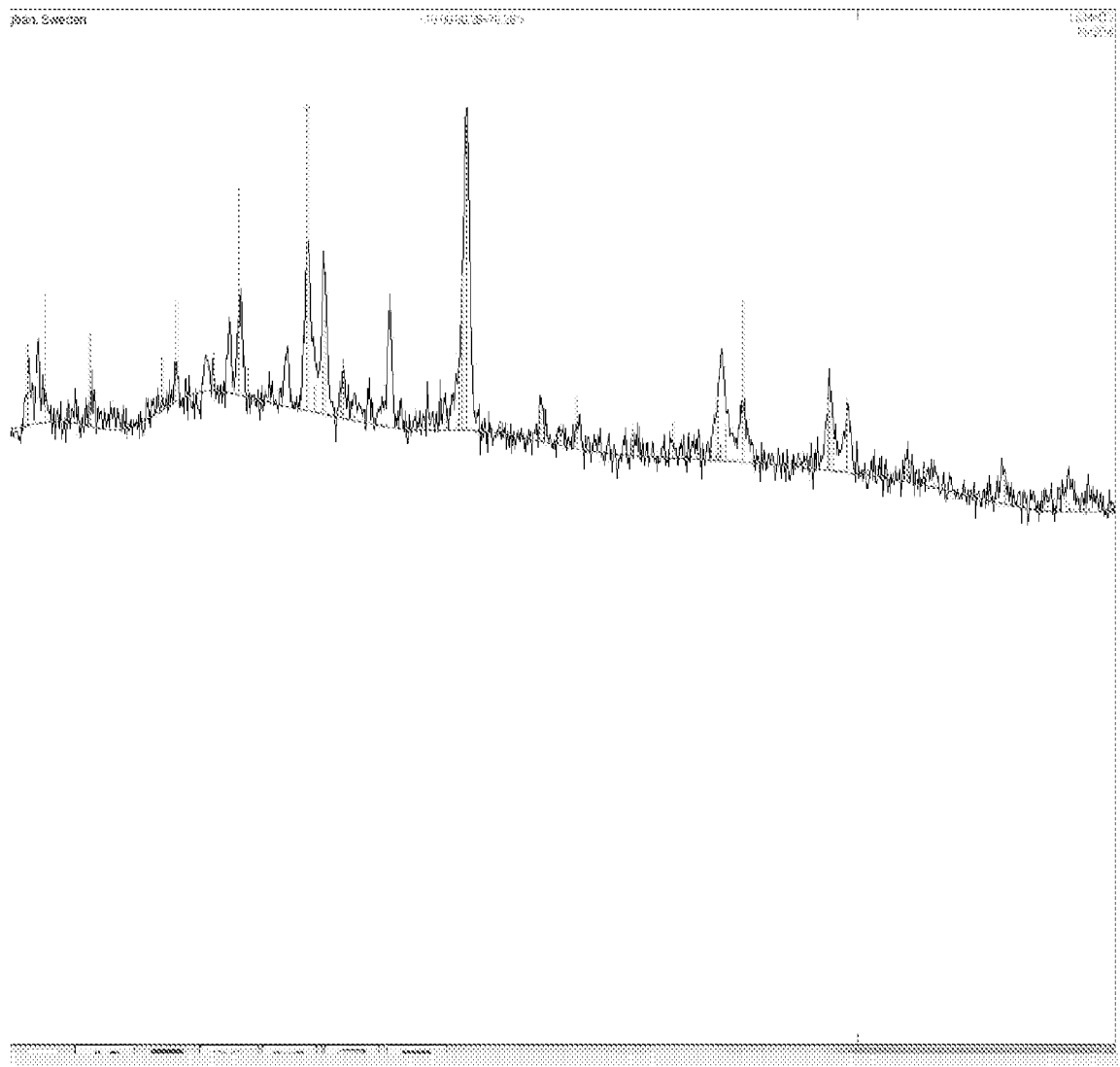
FIG. 30 illustrates the X-ray diffraction analysis showing the formation of $Li_2Mn_2O_3$ from $Li(OH)*H_2O$ and $MnCO_3$.
Figure 31:
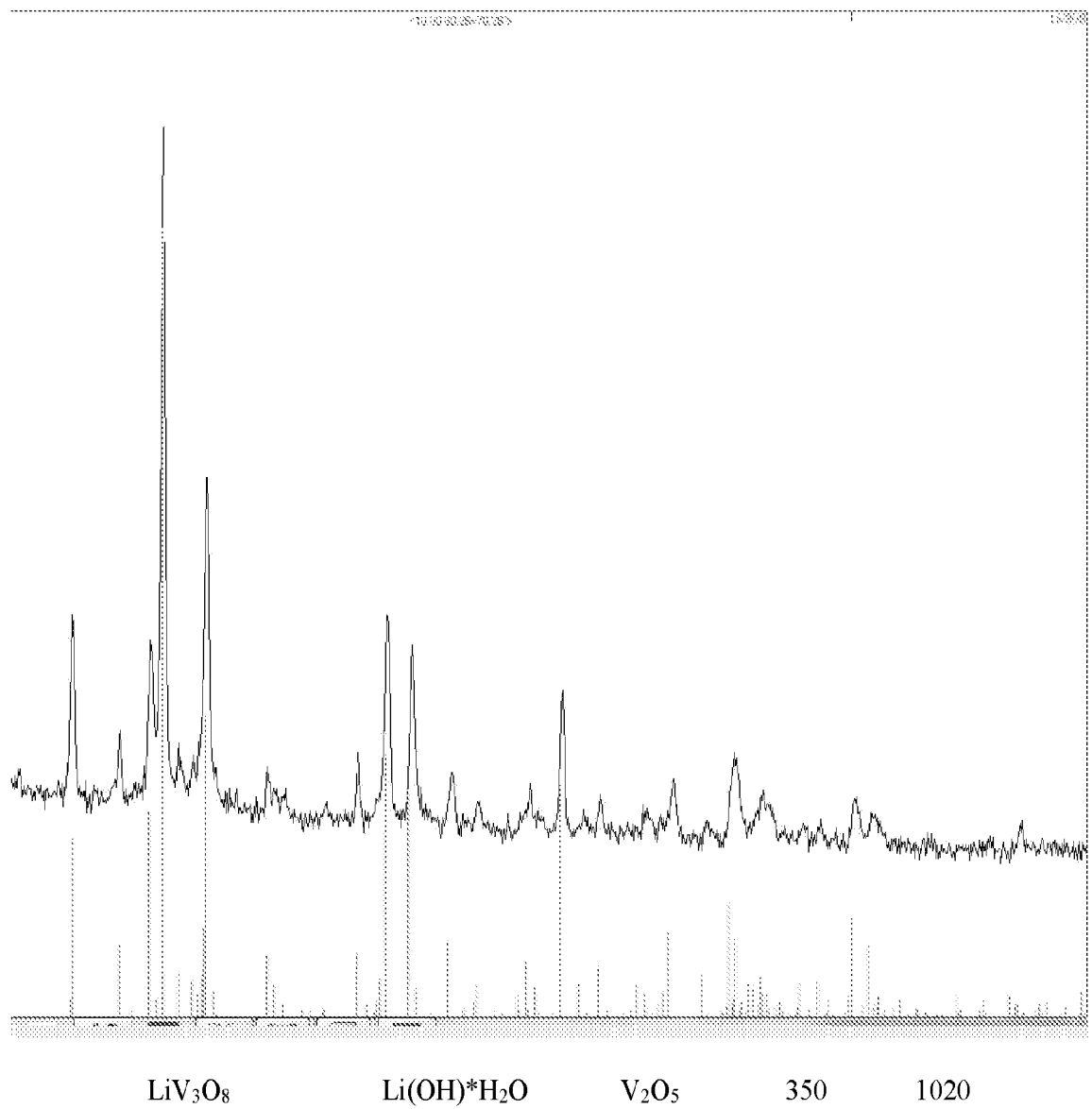
FIG. 31 illustrates the X-ray diffraction analysis showing the formation of $LiV_3O_8$.
Figure 32:
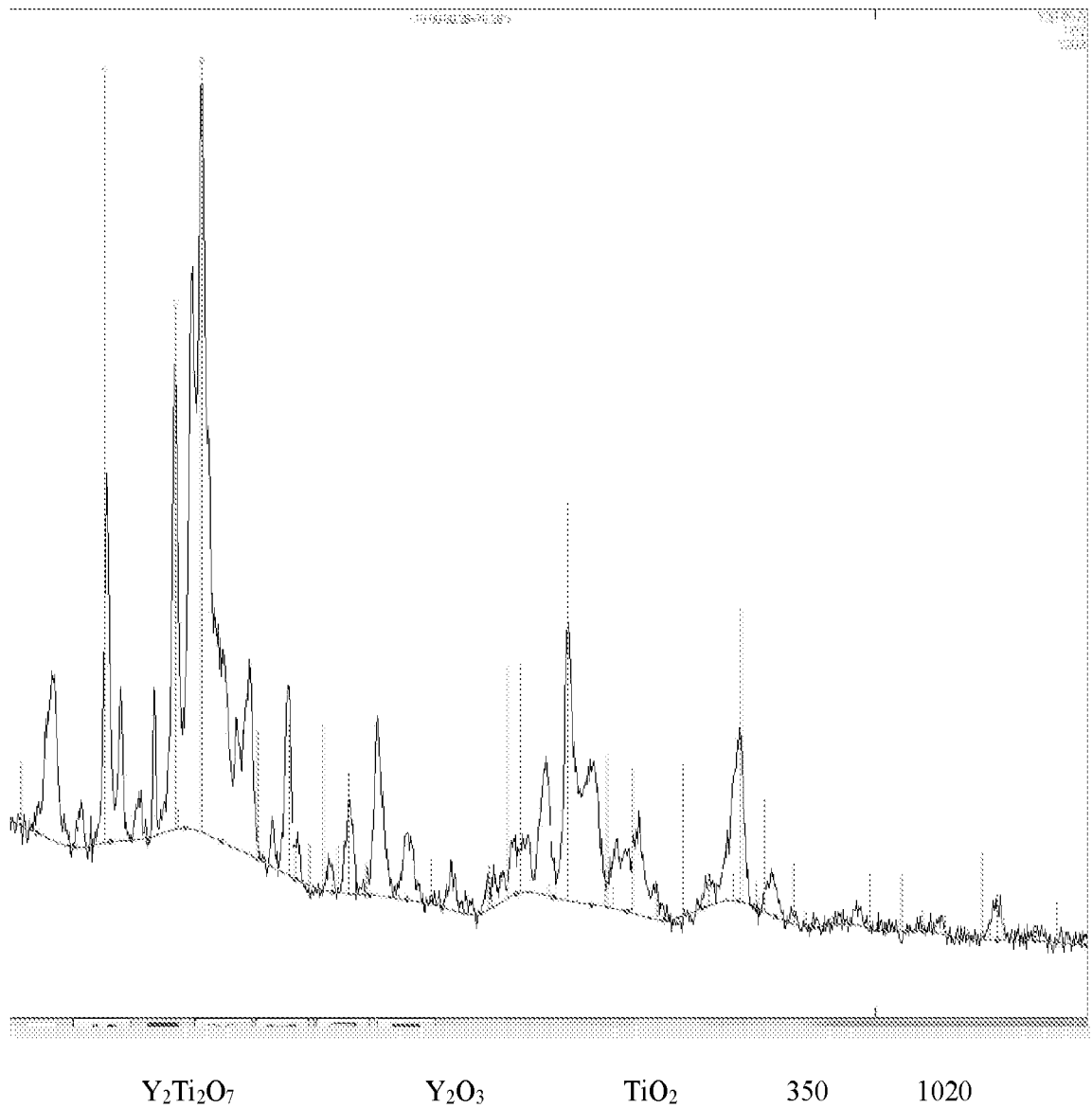
FIG. 32 illustrates the X-ray diffraction analysis showing the formation of $Y_2Ti_2O_7$.
Figure 33:
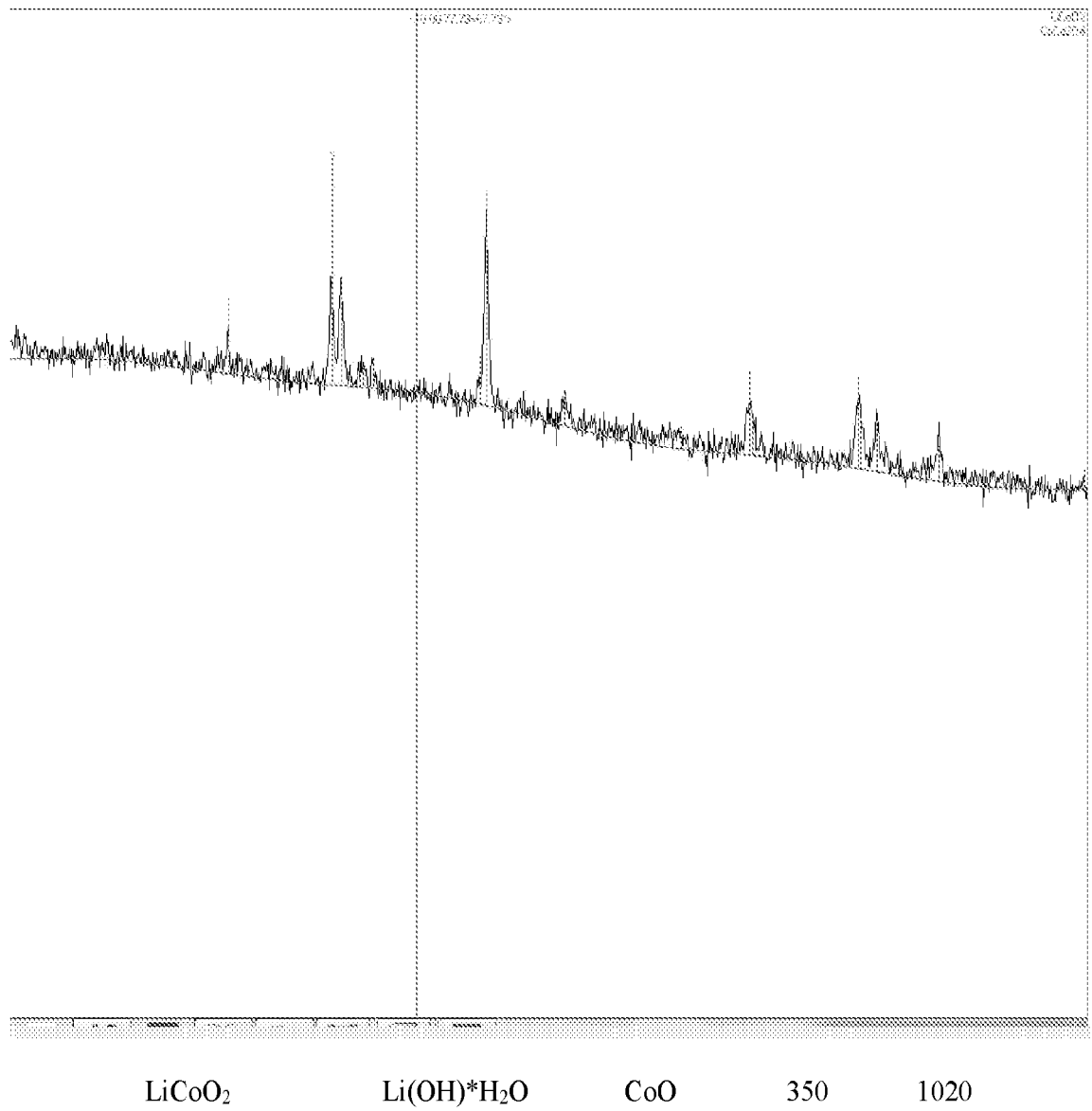
FIG. 33 illustrates the X-ray diffraction analysis showing the formation of $LiCoO_2$.

The X-ray diffraction patterns are also provided for $CaTiO_3$. (FIG. 24), $Y_3Al_5O_{12}$ (FIG. 25), $ZnAl_2O_4$ (FIG. 26), $Ba_2Ti_9O_{20}$ (FIG. 27), $Li_2MnO_3$ and $LiMn_2O_4$ from $Li_2CO_3$ and $Mn_2O_3$ (FIG. 28), $Mg_{0.833}Al_{0.167}(OH)_2(CO_3)_{0.083}(H_2O)_{0.75}$ (FIG. 29), $Li_2Mn_2O_3$ from $Li(OH)*H_2O$ and $MnCO_3$ (FIG. 30), $LiV_3O_8$ (FIG. 31), $Y_2Ti_2O_7$ (FIG. 32), and $LiCoO_2$ (FIG. 33).

It will be appreciated by persons skilled in the art that the present invention is not limited to what has been particularly shown and described. Rather, the scope of the present invention is defined by the claims which follow. It should further be understood that the above description is only representative of illustrative examples of embodiments. The description has not attempted to exhaustively enumerate all possible variations. The alternate embodiments may not have been presented for a specific portion of the invention, and may result from a different combination of described portions, or that other un-described alternate embodiments may be available for a portion, is not to be considered a disclaimer of those alternate embodiments. It will be appreciated that many of those un-described embodiments are within the literal scope of the following claims, and others are equivalent.

The invention claimed is:

1. A method of increasing the reaction yield of β-$CaSiO_3$ produced by hydrothermal vapor synthesis from calcite and quartz, the method comprising:
    blending a source of $CaCO_3$ (calcite) and a source of $SiO_2$ (quartz), wherein the source of $CaCO_3$ is limestone, the source of $SiO_2$ is siliceous sand, the initial particle size of said sand comprises 100 mesh particles and the initial particle size of said limestone comprises 150 mesh particles, provided that the sand particles do not comprise 350 mesh particles and the limestone particles do not comprise 600 mesh particles;
    mixing the limestone and sand blend with a 5 to 25 wt % NaCl solution and drying said mixture, followed by drying and further mixing until a uniform and homogeneous reaction mixture is obtained;
    adding said mixture and water to a reaction vessel, wherein the amount of water added to the reaction vessel is sufficient to obtain a partial pressure of water between 700 and 900 psi when the reaction vessel is sealed and heated to a reaction temperature between 350 and 450° C.; and
    heating the reaction vessel between 350 and 450° C.;
    wherein the amount of NaCl and the degree of uniformity and homogeneity of said reaction mixture is effective to provide a yield of the β-$CaSiO_3$ reaction product between 20 and 60 wt % in under one hour.

2. The method of claim 1, wherein the reaction vessel is heated for 1 hour or less.

3. The method of claim 1, wherein the amount of water added to the reaction vessel is sufficient to obtain a partial pressure of water of 700 psi.

4. The method of claim 1, wherein the reaction vessel is heated to a reaction temperature of 350° C.

5. The method of claim 1, wherein the reaction vessel is heated for a period of 1 hour.

6. The method of claim 1, wherein the mole ratio between the source of $SiO_2$ and the source of $CaCO_3$ ranges from about 0.5:1 to about 3:1.

7. The method of claim 1 wherein the mole ratio between the source of $SiO_2$ and the $CaCO_3$ source is between 1:2 and 2:1.

8. The method of claim 1, wherein the source of $CaCO_3$ comprises more than about 70% calcium carbonate by weight.

9. The method of claim 1, wherein the mixture is suspended above the water within the reaction vessel.

10. The method of claim 1, wherein the reaction vessel is a continuous reaction vessel.

11. The method of claim 1, wherein the reaction vessel is a batch reaction vessel.

12. The method of claim 1, wherein the reaction vessel is a semi-continuous reaction vessel.

13. The method of claim 1, further comprising changing the amount of water to adjust the partial pressure during the step of heating the reaction vessel.

14. The method of claim 1, wherein the amount of water ranges from about 5% to about 25% of the total volume of the reaction vessel.

15. The method of claim 1, wherein the amount of water ranges from about 10% to about 16% of the total volume of the reaction vessel.

16. The method of claim 1, wherein the reaction vessel is heated to a temperature between 350 and 400° C.

17. The method of claim 1 wherein the mole ratio between the source of $SiO_2$ and the $CaCO_3$ source is between 0.6:1 and 1:1.

* * * * *

UNITED STATES PATENT AND TRADEMARK OFFICE
CERTIFICATE OF CORRECTION

| | | |
|---|---|---|
| PATENT NO. | : 11,332,847 B2 | Page 1 of 1 |
| APPLICATION NO. | : 16/067180 | |
| DATED | : May 17, 2022 | |
| INVENTOR(S) | : Richard E. Riman et al. | |

It is certified that error appears in the above-identified patent and that said Letters Patent is hereby corrected as shown below:

In the Specification

At Column 1, Line number 15 insert:
--STATEMENT REGARDING FEDERALLY SPONSORED RESEARCH
This invention was made with government support under DE-AR0001399 awarded by the U.S. Department of Energy, and N00014-12-0524 awarded by the U.S Department of Defense Office of Naval Research. The government has certain rights in the invention.--

Signed and Sealed this
Thirty-first Day of December, 2024

Derrick Brent
*Acting Director of the United States Patent and Trademark Office*